US008065592B2

(12) United States Patent
Stankovic et al.

(10) Patent No.: US 8,065,592 B2
(45) Date of Patent: Nov. 22, 2011

(54) MULTI-SOURCE DATA ENCODING, TRANSMISSION AND DECODING USING SLEPIAN-WOLF CODES BASED ON CHANNEL CODE PARTITIONING

(75) Inventors: Vladimir M. Stankovic, Bryan, TX (US); Angelos D. Liveris, Stafford, TX (US); Zixiang Xiong, Spring, TX (US); Costas N. Georghiades, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 12/847,968

(22) Filed: Jul. 30, 2010

(65) Prior Publication Data

US 2011/0029846 A1 Feb. 3, 2011

Related U.S. Application Data

(62) Division of application No. 11/069,935, filed on Mar. 1, 2005, now Pat. No. 7,779,326.

(51) Int. Cl.
*H03M 13/00* (2006.01)
(52) U.S. Cl. .................................... 714/781; 714/801
(58) Field of Classification Search .................. 714/781, 714/801
See application file for complete search history.

(56) References Cited

U.S. PATENT DOCUMENTS

| | | | |
|---|---|---|---|
| 3,568,148 A * | 3/1971 | Clark, Jr. .......................... 714/785 |
| 4,084,137 A | 4/1978 | Welti |
| 4,191,970 A * | 3/1980 | Witsenhausen et al. ... 348/420.1 |
| 5,499,254 A | 3/1996 | Ikekawa et al. |
| 5,805,615 A | 9/1998 | Chen |
| 6,219,817 B1 | 4/2001 | Holman |
| 6,263,029 B1 | 7/2001 | Alard et al. |
| 6,441,764 B1 | 8/2002 | Barron et al. |
| 6,516,443 B1 * | 2/2003 | Zook .............................. 714/792 |
| 6,799,287 B1 * | 9/2004 | Sharma et al. ................. 714/703 |
| 6,810,499 B2 | 10/2004 | Sridharan et al. |
| 6,895,547 B2 | 5/2005 | Eleftheriou et al. |
| 7,278,085 B1 | 10/2007 | Weng et al. |
| 7,295,137 B2 | 11/2007 | Liu et al. |
| 7,653,867 B2 * | 1/2010 | Stankovic et al. ............. 714/785 |
| 7,746,758 B2 | 6/2010 | Stolpman |
| 7,779,326 B2 * | 8/2010 | Stankovic et al. ............. 714/752 |
| 2002/0176494 A1 | 11/2002 | Zhao et al. |
| 2006/0048038 A1 * | 3/2006 | Yedidia et al. ................. 714/793 |

OTHER PUBLICATIONS

A. D. Wyner, "The Rate-Distortion Function for Source Coding with Side Information at the Decoder-11: General Sources", *Information and Control*, 1978; pp. 60-80; vol. 38.
Sergio D. Servetto, "Lattice Quantization with Side Information," *Data Compression Conference Proceedings*; 2000; pp. 1-10.

(Continued)

*Primary Examiner* — Esaw Abraham
(74) *Attorney, Agent, or Firm* — Knobbe, Martens, Olson & Bear LLP

(57) ABSTRACT

System and method for designing Slepian-Wolf codes by channel code partitioning. A generator matrix is partitioned to generate a plurality of sub-matrices corresponding respectively to a plurality of correlated data sources. The partitioning is performed in accordance with a rate allocation among the plurality of correlated data sources. A corresponding plurality of parity matrices are generated based respectively on the sub-matrices, where each parity matrix is useable to encode data from a respective one of the correlated data sources.

29 Claims, 11 Drawing Sheets

OTHER PUBLICATIONS

Xin Wang and Michael T. Orchard, "Design of Trellis Codes for Source Coding with Side Information at the Decoder", Data Compression Conference Proceedings; 2001; pp. 361-370.

Patrick Mitran and Jan Bajcsy, "Coding for the Wyner-Ziv Problem with Turbo-Like Codes," *IEEE International Symposium on Information Theory*; Jun./Jul. 2002; p. 91.

Anne Aaron, Rui Zhang and Bernd Girod, "Wyner-Ziv Coding of Motion Video," *Conference Record of the 36th Asilomar Conference on Signals, Systems and Computers*; Nov. 2002; pp. 240-241; vol. 1.

David Rebollo-Monedero, Rui Zhang, and Bernd Girod, "Design of Optimal Quantizers for Distributed Source Coding," *Data Compression Conference Proceedings*; Mar. 2003; pp. 13-22.

Angelos Liveris, Zixiang Xiong and Costas N. Georghiades; "Nested Convolutional/Turbo Codes for the Binary Wyner-Ziv Problem," *International Conference on Image Processing Proceedings*; Sep. 2003, pp. I-601-I-604, vol. 1.

Zixiang. Xiong, Angelos D. Liveris, Samuel Cheng, and Zhixin Liu, "Nested Quantization and Slepian-Wolf Coding: A Wyner-Ziv Coding Paradigm for I.I.D. Sources," *IEEE Workshop on Statistical Signal Processing*; Sep./Oct. 2003, pp. 399-402.

Zhixin Liu, Samuel Cheng, Angelos Liveris, and Zixiang Xiong, "Slepian-Wolf Coded Nested Quantization (SWC-NQ) for Wyner-Ziv Coding: Performance Analysis and Code Design," *Data Compression Conference Proceedings*, Mar. 2004, pp. 322-331.

Gottfried Ungerboeck, "Channel Coding with Multilevel/Phase Signals," *IEEE Transactions on Information Theory*, Jan. 1982, pp. 55-67, vol. IT-28, No. 1.

Michael W. Marcellin and Thomas R Fischer, "Trellis Coded Quantization of Memoryless and Gauss-Markov Sources," *IEEE Transactions on Communications*, Jan. 1990, pp. 82-93; vol. 38, No. 1.

Ram Zamir and Shlomo Shamai, "Nested Linear/Lattice Codes for Wyner-Ziv Encoding," *Information Theory Workshop*, Jun. 1998, pp. 92-93.

J. H. Conway, E. M. Rains and N. J. A. Sloane, "On the Existence of Similar Sublattices," *Canadian Journal of Mathematics*, 1999, pp. 1300-1306, vol. 51, No. 6.

Ram Zamir, Shlomo Shamai, and Uri Erez; "Nested Linear/Lattice Codes for Structured Multiterminal Binning," *IEEE Transactions on Information Theory*, Jun. 2002, pp. 1250-1276: vol. 48, No. 6.

M. Vedat Eyuboglu and G. David Forney, Jr., "Lattice and Trellis Quantizations with Lattice- and Trellis-Bounded Codebooks—High-Rate Theory for Memoryless Sources," *IEEE Transactions on Information Theory*, Jan. 1993; pp. 46-59; vol. 39, No. 1.

David J. C. Mackay, "Good Error-Correcting Codes Based on Very Sparse Matrices," *IEEE Transactions on Information Theory*; Mar. 1999; pp. 399-431; vol. 45, No. 2.

D. J. C. Mackay and R. M. Neal, "Near Shannon limit performance of low density parity check codes," *Electronics Letters*; Mar. 13, 1997; pp. 457-458; vol. 33, No. 6.

David Rebollo-Monedero, Anne Aaron, and Bernd Girod, "Transforms for High-Rate Distributed Source Coding"; *Conference Record of the 37th Asilomar Conference on Signals, Systems and Computers*; Nov. 2003; pp. 850-854; vol. 1.

Ram Zamir, "The Rate Loss in the Wyner-Ziv Problem," *IEEE Transactions on Information Theory*, Nov. 1996, pp. 2073-2084, vol. 42, No. 6.

Vahid Tarokh, Alexander Vardy, and Kenneth Zeger, "Universal Bound on the Performance of Lattice Codes," *IEEE Transactions on Information Theory*, Mar. 1999; pp. 670-681; vol. 45, No. 2.

Lori A. Dalton, "Analysis of 1-D Nested Lattice Quantization and Slepian-Wolf Coding for Wyner-Ziv Coding of i.i.d. Sources," *Project report for ELEN 663*, Texas A&M University, May 2003.

G. David Forney, Jr., "Coset Codes—Part 11: Binary Lattices and Related Codes," *IEEE Transactions on Information Theory*, Sep. 1988; pp. 1152-1187; vol. 34, No. 5.

Angelos Liveris, Zixiang Xiong and Costas N. Georghiades, "Compression of Binary Sources With Side Information at the Decoder Using LDPC Codes," *IEEE Communications Letters*, Oct. 2002; pp. 440-442, vol. 6, No. 10.

David Slepian and J.K. Wolf; "Noiseless Coding of Correlated Information Sources"; IEEE Transactions on Information Theory; Jul. 1973; pp. 471-480; vol. 19, No. 4.

Toby Berger; "Multiterminal Source Coding", CISM Summer School on the Information Theory Approach to Communications; Jul. 1977; Springer-Verlag, New York.

Jack Keil Wolf; "Data reduction for multiple correlated sources"; Proceeding of the 5$^{th}$ Colloquium on Microwave Communication; Jun. 1973; pp. 287-295; Budapest, Hungary.

Tomas M. Cover; "A proof of the data compression theorem of Slepian and Wolf for ergodic sources"; IEEE Transactions on Information Theory; Mar. 1975; pp. 226-228; vol. 21, Issue 2.

Aaron D. Wyner; "Recent Results in the Shannon Theory"; IEEE Transactions on Information Theory; Jan. 1974; pp. 2-10; vol. 20, No. 1.

Aaron D. Wyner; "On Source Coding with Side Information at the Decoder," IEEE Transactions on Information Theory; May 1975; pp. 294-300; vol. 21, No. 3.

Janos Korner and Katalin Marton; "Images of a Set via Two Channels and their Role in Multi-User Communication"; IEEE Transactions on Information Theory; Nov. 1977; pp. 751-761; vol. iT-23.

Rudolf F. Ahlswede and Janos Korner; Source Coding with Side Information and a Converse for Degraded Broadcast Channels; IEEE Transactions on Information Theory; Nov. 1975; pp. 629-637; vol. 21, No. 6.

Andrea Sgarro; "Source Coding with Cide Information at Several Decoders," IEEE Transactions on Information Theory; Mar. 1977; pp. 179-182; vol. 23, No. 2.

R. M. Gray and A. D. Wyner; "Source Coding for a Simple Network," The Bell System Technical Journal; Nov. 1974; pp. 1681-1721; vol. 53.

S. I. Gelfand and M. S. Pinsker; "Coding of Sources on the Basis of Observations with Incomplete Information"; Translated from Problemy Peredachi Informatisii; Apr.-Jun. 1979; pp. 115-125; vol. 15, No. 2.

Te Sun Han and Kingo Kobayashi; "A unified achievable rate region for a general class of multi terminal source coding systems"; IEEE Transactions on Information Theory; May 1980; pp. 277-288; vol. 26, No. 3.

Imre Csiszar and Janos Korner; "Towards a General Theory of Source Networks"; IEEE Transactions on Information Theory; Mar. 1980; pp. 155-165; vol. 26, No. 2.

S. Sandeep Pradhan and Kannan Ramchandran; "Distributed Source Coding Using Syndromes (DISCUS): Design and Construction"; IEEE Transactions on Information Theory; Mar. 2003; pp. 626-643; vol. 49, No. 3.

Angelos D. Liveris, Zixiang Xiong and Costas N. Georghiades; "Distributed Compression of Binary Sources Using Conventional Parallel and Serial Concatenated Convolutional Codes"; Proceedings of Data Compression Conference; Mar. 2003; pp. 193-202; Snowbird, UT.

Anne Aaron and Bernd Girod; "Compression of Side Information Using Turbo Codes"; Proceeding of Data Compression conference; Apr. 2002; pp. 252-261; Snowbird, UT.

Javier Garcia-Frias and Ying Zhao; "Compression of Correlated Binary Sources Using Turbo Codes"; IEEE Communications Letters; Oct. 2001; pp. 417-419; vol. 5., No. 10.

Jan Bajcy and Patrick Mitran; "Coding for the Slepian-Wolf Problem With Turbo Codes"; Global Telecommunications Conference; Nov. 2001; pp. 1400-1404; vol. 2; San Antonio, TX.

A. Liveris, Z. Xiong, and C. Georghiades; "Compression of binary sources with side information at the decoder using LDPC codes"; IEEE Communications Letters, Oct. 2002; pp. 440-442; vol. 6.

Jing Li, Zhenyu Tu and Rick S. Blum; "Slepian-Wolf Coding for Nonuniform Sources Using Turbo Codes"; Proceedings of the Data Compression Conference; Mar. 2004; pp. 312-321; Snowbird, UT.

Jim Chou, S. Sandeep Pradhan and Kannan Ramchandran; "Turbo and Trellis-Based Constructions for Source Coding with Side Information"; Proceedings of the Conference on Data Compression; Mar. 2003; pp. 33-42; Snowbird, UT.

B. Rimoldi and R. Urbanke; "Asynchronous Slepian-Wolf Coding Via Source-Splitting", IEEE International Symposium on Information Theory; Jun. 1997; p. 271; Ulm, Germany.

Todd P. Coleman, Anna H. Lee, Muriel Medard, and Michelle Effros; "On Some New Approaches to Practical Slepian-Wolf Compression Inspired by Channel Coding"; Proceedings of Data Compression Conference; Mar. 2004; pp. 282-291; Snowbird, UT.

J. M. Kahn, R. H. Katz and K. S. J. Pister; "Next Century Challenges: Mobile Networking for 'Smart dust'"; International Conference on Mobile Computing and Networking; Aug. 1999; pp. 271-278.

Angelos D. Liveris, Ching-Fun Lan, Krishna R. Narayanan, Zixiang Xiong and Costas N. Georghiades; "Slepian-Wolf Coding of Three Binary Sources Using LDPC Codes"; Proceedings of International Symposium on Turbo Codes and Related Topics; Sep. 2003; Brest, France.

Ching-Fu Lan, Angelos D. Liveris, Krishna Narayanan, Zixiang Xiong and Costas Georghiades; "Slepian-Wolf Coding of Multiple M-ary Sources Using LDPC Codes"; Proc. DCC-2004, Data Compression Conference, pp. 549, Snowbird, UT, Mar. 2004.

S. San Deep Pradhan and Kannan Ramchandran; "Distributed source coding: Symmetric rates and applications to sensor networks"; Proceedings of Data Compression Conference; Mar. 2000; pp. 363-372; Snowbird, UT.

Ram Zamir, Shlomo Shamai and Uri Erez; "Nested Linear/Lattice Codes for Structured Multiterminal Binning"; IEEE Transactions on Information Theory; Jun. 2002; pp. 1250-1276; vol. 48, No. 6.

Vladimir Stankovic, Angelos D. Iiveris, Zixiang Xiong and Costas Georghiades; "Design of Slepian-Wolf Codes by Channel Code Partitioning"; Proceedings of Data Compression Conference; Mar. 2004; pp. 302-311, Snowbird, UT.

Vladimir Stankovic, Angelos D. Liveris, Zixiang Xiong and Costas Georghiades; Code Design for Lossless Multiterminal Networks; International Symposium on Information Theory; Jun. 2004; p. 26.

Nicolas Gehrig and Pier Luigi Dragotti; "Symmetric and A-Symmetric Slepian-Wolf Codes with Systematic and Non-Systematic Linear Codes"; IEEE Communications Letters; Jan. 2005; pp. 61-63; vol. 9, No. 1.

Hui Jin, Aamod Khandekar and Robert McEliece; "Irregular Repeat-Accumulate Codes"; Proceedings of International Symposium on Turbo Codes and Related Topics; Sep. 2000; pp. 1-8.

Claude Berrou, Alain Glavieux and Punya Thitimajshima; Near Shannon limit error-correcting coding and decoding: Turbo codes (1)°; IEEE International Conference on Communications; 1993; pp. 1064-1070; Geneva, Switzerland.

D. Schonberg, K. Ramchandran and S.S. Pradhan; "Distributed code constructions for the entire Slepian-Wolf rate region for arbitrarily correlated sources"; Proceedings of Data Compression Conference; Mar. 2004; pp. 292-301, Snowbird, UT.

G. David Forney, Jr.; "Coset Codes—Part I: Introduction and Geometrical Classification"; IEEE Transactions on Information Theory; Sep. 1988; pp. 1123-1151; vol. 34, No. 5.

G. David Forney, Jr.; "Coset Codes—Part II: Binary Lattices and Related Codes;" IEEE Transactions on Information Theory; Sep. 1988; pp. 1152-1187; vol. 34, No. 5.

G. David Forney, Jr.; "Geometrically Uniform Codes;" IEEE Transactions on Information Theory; Sep. 1991; pp. 1241-1260; vol. 37, No. 5.

Giuseppe Caire, Shlomo Shamai and Sergio Verdu; "Lossless Data Compression with Error Correcting Codes;" IEEE International Symposium on Information Theory; Jun.-Jul. 2003; p. 22.

Prashant Koulgi, Ertem Tuncel, Shankar L. Regunathan and Kenneth Rose; "On Zero-Error Coding of Correlated Sources," IEEE Transactions on Information Theory; Nov. 2003; pp. 2856-2873; vol. 49, No. 11.

Toby Berger, Zhen Zhang and Harish Viswanathan; "The CEO Problem," IEEE Transactions on Information Theory; May 1996; pp. 887-902; vol. 42, No. 3.

Aaron D. Wyner and Jacob Ziv; "The Rate-Distortion Function for Source Coding with Side Information at the Decoder", IEEE Transactions on Information Theory; Jan. 1976; pp. 1-10; vol. 22, No. 1.

Yasutada Oohama; "The Rate-Distortion Function for the Quadratic Gaussian CEO Problem"; IEEE Transactions on Information Theory; May 1998; pp. 1057-1070; vol. 44, No. 3.

Yang Yang, Samuel Cheng, Zixiang Xiong, and Wei Zhao; "Wyner-Ziv coding based on TCQ and LDPC codes"; 37th Asilomar Conference on Signals, Systems, and Computers; Nov. 2003; pp. 825-829; Pacific Grove, CA.

* cited by examiner

US 8,065,592 B2

MULTI-SOURCE DATA ENCODING, TRANSMISSION AND DECODING USING SLEPIAN-WOLF CODES BASED ON CHANNEL CODE PARTITIONING

CROSS-REFERENCE TO RELATED APPLICATIONS

This application is a divisional of U.S. patent application Ser. No. 11/069,935, filed Mar. 1, 2005, now U.S. Pat. No. 7,779,326, entitled "MULTI-SOURCE DATA ENCODING, TRANSMISSION AND DECODING USING SLEPIAN-WOLF CODES BASED ON CHANNEL CODE PARTITIONING" which is incorporated by reference herein in its entirety.

U.S. Government has a paid-up license in this invention and the right in limited circumstances to require the patent owner to license others on reasonable terms as provided for by the terms of grant number CCR-01-04834 awarded by the National Science Foundation (NSF).

FIELD OF THE INVENTION

The present invention relates to the field of information coding/decoding, and more particularly to a system and method for designing Slepian-Wolf codes for distributed source encoding/decoding.

DESCRIPTION OF THE RELATED ART

Issues related to distributed lossless compression of correlated sources are relevant for a wide variety of applications, such as distributed sensor networks and multi-source video distribution, both wired and wireless, coding for relay channels, and digital communications, among others. Distributed source coding (DSC), whose theoretical foundation was laid by Slepian and Wolf as early as 1973 (see D. Slepian and J. K. Wolf, "Noiseless coding of correlated information sources," *IEEE Trans. On Information Theory*, vol. IT-19, pp. 471-480, July 1973, incorporated by reference herein.), refers to the compression of the outputs of two or more physically separated sources that do not communicate with each other (hence distributed coding). These sources send their compressed outputs to a central point (e.g., the base station) for joint decoding. DSC is related to the well-known "CEO problem" (in which a source is observed by several agents, who send independent messages to another agent (the chief executive officer (CEO)), who attempts to recover the source to meet a fidelity constraint, where it is usually assumed that the agents observe noisy versions of the source, with the observation noise being independent from agent to agent), and is part of network information theory.

Compressing two distinct signals by exploiting their correlation can certainly provide a benefit in total rate cost. Moreover, Slepian and Wolf showed that lossless compression of two separate sources can be as efficient as if they are compressed together as long as joint decoding is done at the receiver. Several successful attempts of constructing practical coding schemes that exploit the potential of the Slepian-Wolf (SW) theorem have been developed. See, e.g., S. S. Pradhan and K. Ramchandran, "Distributed source coding using syndromes (DISCUS): design and construction," *Proc. DCC-1999, Data Compression Conference*, pp. 158-167, Snowbird, Utah, March 1999; A. Liveris, Z. Xiong, and C. Georghiades, "Compression of binary sources with side information at the decoder using LDPC codes," *IEEE Communications Letters*, vol. 6, pp. 440-442, October 2002; A. Liveris, Z. Xiong, and C. Georghiades, "Distributed compression of binary sources using convolutional parallel and serial concatenated convolutional codes," *Proc. DCC-*2003, *Data Compression Conference*, pp. 193-202, Snowbird, Utah, March 2003; A. Aaron and B. Girod, "Compression of side information using turbo codes," *Proc. DCC-*2002, *Data Compression Conference*, pp. 252-261, Snowbird, Utah, April 2002; J. Garcia-Frias and Y. Zhao, "Compression of correlated binary sources using turbo codes," *IEEE Communications Letters*, vol. 5, pp. 417-419, October 2001; and J. Bajcy and P. Mitran, "Coding for the Slepian-Wolf problem with turbo codes," *Proc. IEEE Globecom-*2001, vol. 2 pp. 1400-1404, San Antonio, Tex., November 2001, all of which are incorporated by reference herein. All these schemes, with the exception of that of Garcia-Frias and Zhao, are based on asymmetric codes (see, e.g., S. S. Pradhan and K. Ramchandran, "Generalized coset codes for symmetric distributed source coding," included herewith as Appendix G); that is, they losslessly compress one source, while the other source is assumed to be perfectly known at the decoder side and is used as side information.

Thus, for two discrete, memoryless, identically distributed sources X and Y encoded separately at rates $R_1$ and $R_2$, respectively, these codes attempt to reach the two corner points on the Slepian-Wolf (SW) bound: $(R_1,R_2)=(H(X),H(Y|X))$ and $(R_1,R_2)=(H(Y),H(X|Y))$. However, often it is desirable to vary the rates of individual encoders while keeping the total sum-rate constant. One technique for achieving this is time sharing. However, time sharing might not be practical because it requires exact synchronization among encoders.

A second technique is the source-splitting approach of Rimoldi and Urbanke (see B. Rimoldi and R. Urbanke, "Asynchronous Slepian-Wolf coding via source-splitting", *Proc. ISIT-*1997 *IEEE Int. Symp. Information Theory*, pp. 271, Ulm, Germany, June, 1997, incorporated by reference herein), which potentially reaches all points on the SW bound by splitting two sources into three subsources of lower entropy. Garcia-Frias and Zhao, in the reference cited above, proposed a system consisting of two different turbo codes which form a large turbo code with four component codes. In the symmetric scenario suggested (where the rates of both encoders are the same), half of the systematic bits from one encoder and half from the other are sent. Further, instead of syndrome bits, parity bits are sent.

Pradhan and Ramchandran have outlined a method for constructing a single code based on the syndrome technique, which achieves arbitrary rate allocation among the two encoders (see S. S. Pradhan and K. Ramchandran, "Generalized coset codes for symmetric distributed source coding," included herewith as Appendix G; S. S. Pradhan and K. Ramchandran, "Distributed source coding: symmetric rates and applications to sensor networks," Proc. DCC-2000, Data Compression Conference, pp. 363-372, Snowbird, Utah, March 2000; and S. S. Pradhan and K. Ramchandran, "Distributed source coding using syndromes (DISCUS): design and construction," *Proc. DCC-*1999, *Data Compression Conference*, pp. 158-167, Snowbird, Utah, March 1999, incorporated by reference herein.). The method constructs independent subcodes of the main code and assigns them to different encoders. Each encoder sends only partial information about the source; by combining two received bitstreams, a joint decoder should perfectly reconstruct the sources. Since joint decoding is performed only on a single code, if this code approaches the capacity of a channel that models the correlation among the sources, the system will approach the SW limit. Thus, an advantage of this approach is the need of only one good channel code. Pradhan and Ramchandran also showed that this code does not suffer from any performance loss compared to the corresponding asymmetric code. Moreover, any point on the SW bound can be potentially reached without increasing the encoding/decoding complexity. Further, Pradhan and Ramchandran applied the method to coding of two noisy observations of a source with scalar quantizer and trellis codes.

While the theoretical limits and bounds of SW coding are well understood, practical implementations and their actual performance and limits of have not heretofore been determined.

SUMMARY OF THE INVENTION

One embodiment of the present invention comprises a system and method for implementing Slepian-Wolf codes by channel code partitioning.

In one embodiment, a generator matrix is partitioned to generate a plurality of sub-matrices corresponding respectively to a plurality of correlated data sources. The partitioning may be performed in accordance with a rate allocation among the plurality of correlated data sources. A corresponding plurality of parity matrices may then be generated based respectively on the sub-matrices, where each parity matrix is useable to encode correlated data for a respective correlated data source.

BRIEF DESCRIPTION OF THE DRAWINGS

A better understanding of the present invention can be obtained when the following detailed description of the preferred embodiment is considered in conjunction with the following drawings, in which.

Figure 1A:
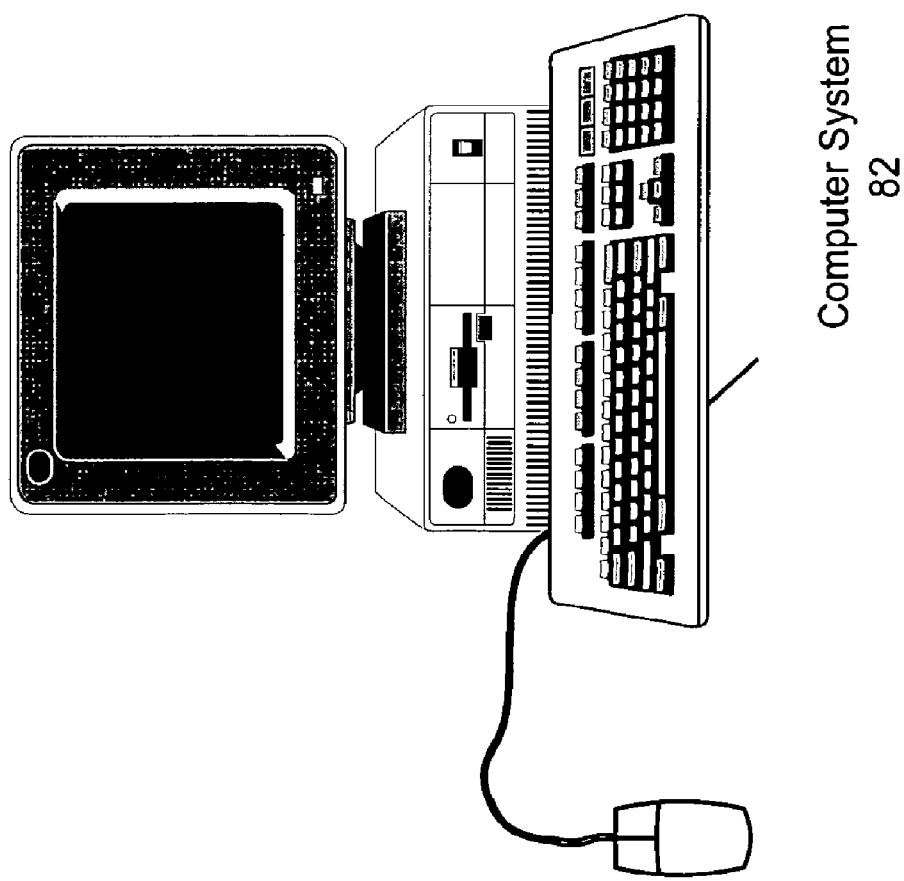
FIG. 1A illustrates a computer system suitable for implementing various embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Provisional Application Ser. No. 60/657,520, titled "Multi-Source Data Encoding, Transmission and Decoding", filed Mar. 1, 2005, whose inventors are Vladimir M. Stankovic, Angelos D. Liveris, Zixiang Xiong, Costas N. Georghiades, Zhixin Liu, and Samuel S. Cheng;

U.S. patent application Ser. No. 11/068,737, titled "Data Encoding and Decoding Using Slepian-Wolf Coded Nested Quantization to Achieve Wyner-Ziv Coding", filed Mar. 1, 2005, whose inventors are Zhixin Liu, Samuel S. Cheng, Angelos D. Liveris, and Zixiang Xiong.

D. Slepian and J. K. Wolf, "Noiseless coding of correlated information sources," *IEEE Trans. On Information Theory*, vol. IT-19, pp. 471-480, July 1973.

S. S. Pradhan and K. Ramchandran, "Distributed source coding using syndromes (DISCUS): design and construction," *Proc. DCC*-1999, *Data Compression Conference*, pp. 158-167, Snowbird, Utah, March 1999.

A. Liveris, Z. Xiong, and C. Georghiades, "Compression of binary sources with side information at the decoder using LDPC codes," *IEEE Communications Letters*, vol. 6, pp. 440-442, October 2002.

A. Liveris, Z. Xiong, and C. Georghiades, "Distributed compression of binary sources using convolutional parallel and serial concatenated convolutional codes," *Proc. DCC*-2003, *Data Compression Conference*, pp. 193-202, Snowbird, Utah, March 2003.

A. Aaron and B. Girod, "Compression of side information using turbo codes," *Proc. DCC*-2002, *Data Compression Conference*, pp. 252-261, Snowbird, Utah, April 2002.

J. Garcia-Frias and Y. Zhao, "Compression of correlated binary sources using turbo codes," *IEEE Communications Letters*, vol. 5, pp. 417-419, October 2001.

J. Bajcy and P. Mitran, "Coding for the Slepian-Wolf problem with turbo codes," *Proc. IEEE Globecom*-2001, vol. 2 pp. 1400-1404, San Antonio, Tex. November 2001.

B. Rimoldi and R. Urbanke, "Asynchronous Slepian-Wolf coding via source-splitting", *Proc. ISIT*-1997 *IEEE Int. Symp. Information Theory*, pp. 271, Ulm, Germany, June, 1997.

S. S. Pradhan and K. Ramchandran, "Distributed source coding: symmetric rates and applications to sensor networks," *Proc. DCC*-2000, *Data Compression Conference*, pp. 363-372, Snowbird, Utah, March 2000.

H. Jin, A. Khandekar, and R McEliece, "Irregular repeat-accumulate codes," *Proc. of 2nd International Symposium on Turbo codes and related topics*, pp. 1-8, September 2000.

T. Berger, "Multiterminal source coding", *The Information Theory Approach to Communications*, G. Longo, Ed., New York: Springer-Verlag, 1977.

C. Berrou, A. Glavieux, and P. Thitimajshima, "Near Shannon limit error-correcting coding and decoding: Turbo codes," *Proc. ICC '93, IEEE Int. Conf. on Comm.*, pp. 1064-1070, Geneva, 1993.

A. D. Wyner and J. Ziv, "The rate-distortion function for source coding with side information at the decoder", *IEEE Trans. on Information Theory*, vol. IT-22, pp. 1-10, January 1976.

J. Chou, S. S. Pradhan and K. Ramchandran, "Turbo and trellis-based constructions for source coding with side information," *Proc. DCC*-2003, *Data Compression Conference*, pp. 33-42, Snowbird, Utah, March 2003.

T. Cover, "A proof of the data compression theorem of Slepian and Wolf for ergodic sources", *IEEE Trans. on Information Theory*, vol. IT-21, pp. 226-228, March 1975.

Y. Oohama, "The Rate-Distortion Function for the Quadratic Gaussian CEO Problem," *IEEE Trans. on Information Theory*, vol. 44, pp. 1057-1070, May 1998.

T. S. Han and K. Kobayashi, "A unified achievable rate region for a general class of multiterminal source coding systems," *IEEE Trans. on Information Theory*, vol. IT-26, pp. 277-288, May 1980.

Y. Yang, S. Chen, Z. Xiong, and W. Zhao, "Wyner-Ziv coding based on TCQ and LDPC codes," *Proc. of 37th Asilomar Conference on Signals, Systems, and Computers*, Pacific Grove, Calif., November 2003.

APPENDICES

This application includes eight appendices labeled A-H.

Appendix A comprises a paper titled: "Design of Slepian-Wolf Codes by Channel Code Partitioning" by Vladimir M. Stankovic, Angelos D. Liveris, Zixiang Xiong, and Costas N. Georghiades.

Appendix B comprises a paper titled: "On Code Design for the Slepian-Wolf Problem and Lossless Multiterminal Networks" by Vladimir M. Stankovic, Angelos D. Liveris, Zixiang Xiong, and Costas N. Georghiades.

Appendix C comprises a paper titled: "Slepian-Wolf Coded Nest Quantization (SWC-NQ) for Wyner-Ziv Coding: Performance Analysis and Code Design" by Zhixin Liu, Samuel S. Cheng, Angelos D. Liveris & Zixiang Xiong.

Appendix D comprises a paper titled: "Slepian-Wolf Coded Nested Lattice Quantization for Wyner-Ziv Coding: High Rate Performance Analysis and Code Design" by Zhixin Liu, Samuel S. Cheng, Angelos D. Liveris & Zixiang Xiong.

Appendix E comprises a paper titled: "Layered Wyner-Ziv Video Coding" by Qian Xu and Zixiang Xiong.

Appendix F comprises a paper titled: "A Turbo Code Tutorial" by William E. Ryan.

Appendix G comprises a paper titled: "Generalized Coset Codes for Symmetric Distributed Source Coding" by S. Sandeep Pradhan and Kannan Ramchandran.

Appendix H comprises a paper titled: "Compression of Binary Sources with Side Information at the Decoder Using LDPC Codes" by Angelos D. Liveris, Zixiang Xiong and Costas N. Georghiades.

TERMS

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

FIG. 1A—Computer System

FIG. 1A illustrates a computer system 82 operable to execute a program configured to implement various embodiments of the present invention. As shown in FIG. 1A, the computer system 82 may include input devices such as a mouse and keyboard, output devices (such as a display device and speakers). The computer system 82 may also include a network interface (e.g., an Ethernet card) for communicating with other computers over a network.

The computer system 82 may include a memory medium(s) on which one or more computer programs or software components according to any of various embodiments of the present invention may be stored. For example, the memory medium may store one or more programs which are executable to perform any or all of the methods described herein. The memory medium may also store operating system software, as well as other software for operation of the computer system. Various embodiments further include receiving or storing instructions and/or data implemented in accordance with the foregoing description upon a carrier medium.

Figure 1B:
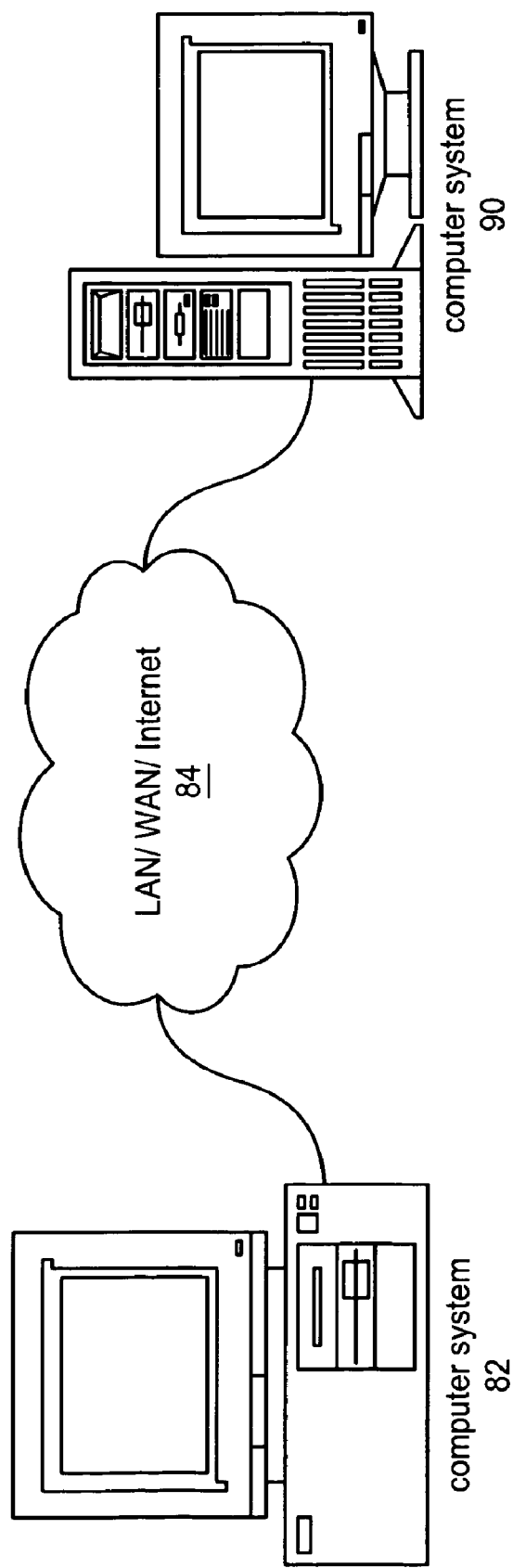
FIG. 1B illustrates a network system comprising two or more computer systems that may implement an embodiment of the present invention.

FIG. 1B—Computer Network

FIG. 1B illustrates a system including a first computer system 82 that is coupled to a second computer system 90. The computer system 82 may be connected through a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a program in a distributed fashion. For example, computer 82 may execute a first portion of the program and computer system 90 may execute a second portion of the program.

As another example, computer 82 may display the graphical user interface of a program and computer system 90 may execute a portion of the program implementing the main functionality (i.e., the non-user interface portion) of the program.

In one embodiment, the graphical user interface of the program may be displayed on a display device of the computer system 82, and the remaining portion of the program may execute on a device 190 connected to the computer system 82. The device 190 may include a programmable hardware element and/or may include a processor and memory medium which may execute a real time operating system. In one embodiment, the program may be downloaded and executed on the device 190. For example, an application development environment with which the program is associated may provide support for downloading a program for execution on the device in a real time system.

Figure 2:
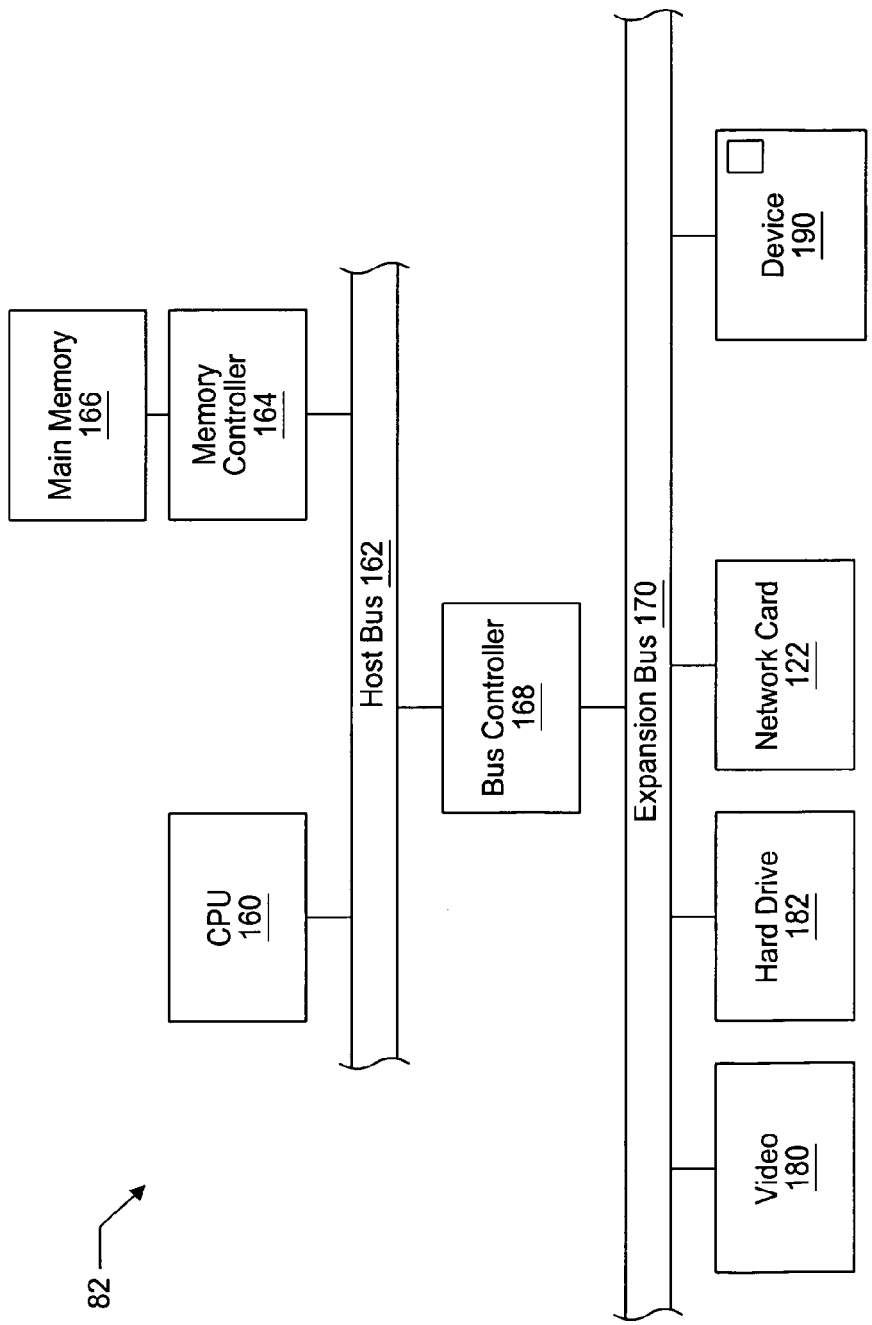
FIG. 2 is an exemplary block diagram of the computer systems of FIGS. 1A and 1B.

FIG. 2—Computer System Block Diagram

FIG. 2 is a block diagram representing one embodiment of the computer system 82 and/or 90 illustrated in FIGS. 1A and 1B. It is noted that any type of computer system configuration or architecture can be used as desired, and FIG. 2 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store programs operable to implement Slepian-Wolf coding according to various embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. As shown, the computer comprises a network card 122 for communication with other devices, e.g., distributed sensor or video distribution systems, other computer systems, etc. The computer 82 further comprises a video display subsystem 180 and hard drive 182 coupled to the expansion bus 170.

As shown, a device 190 may also be connected to the computer. The device 190 may include a processor and memory which may execute a real time operating system. The device 190 may also or instead comprise a programmable hardware element. The computer system may be operable to deploy programs according to various embodiments of the present invention to the device 190 for execution of the program on the device 190.

Figure 3A:
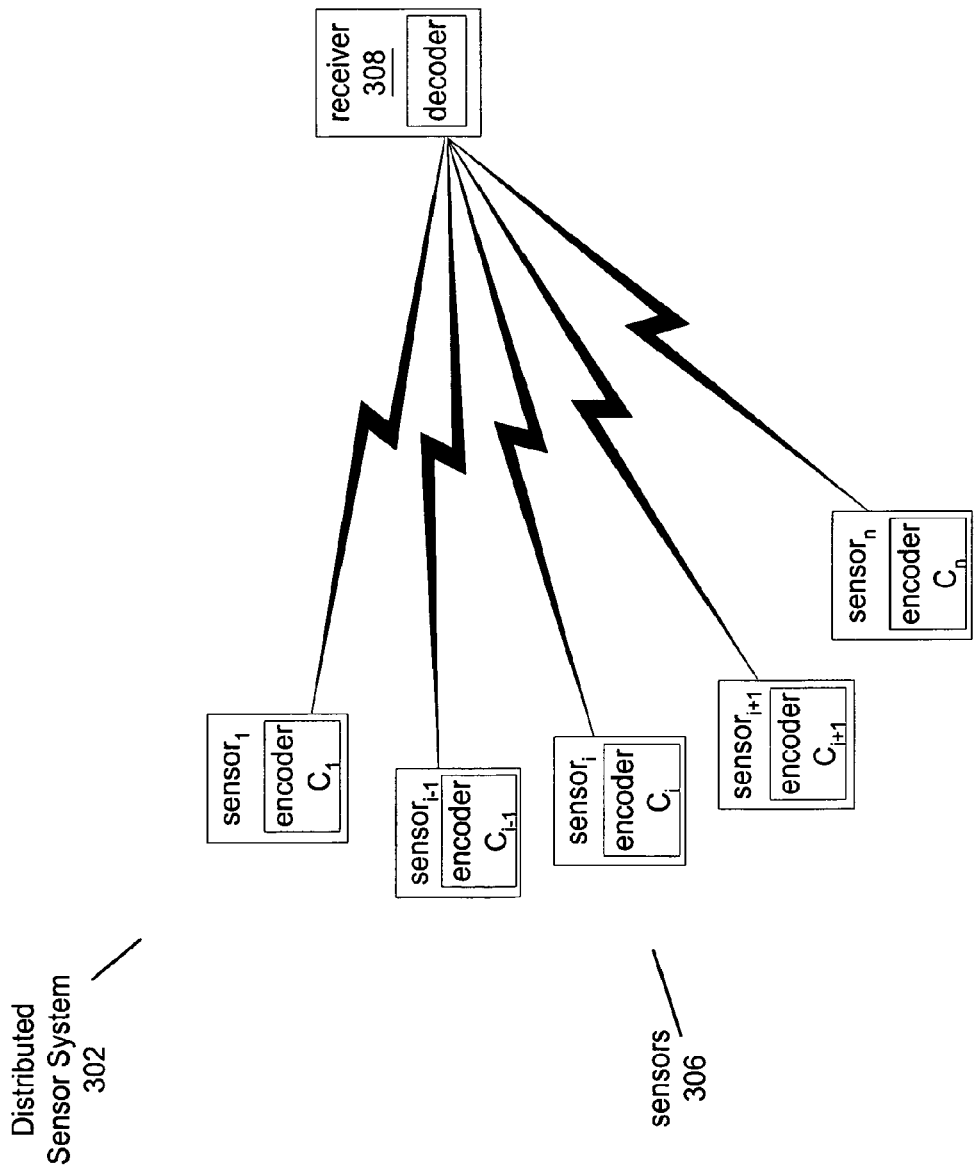
FIGS. 3A and 3B illustrate exemplary applications of the present invention, according to various embodiments.
Figure 3B:
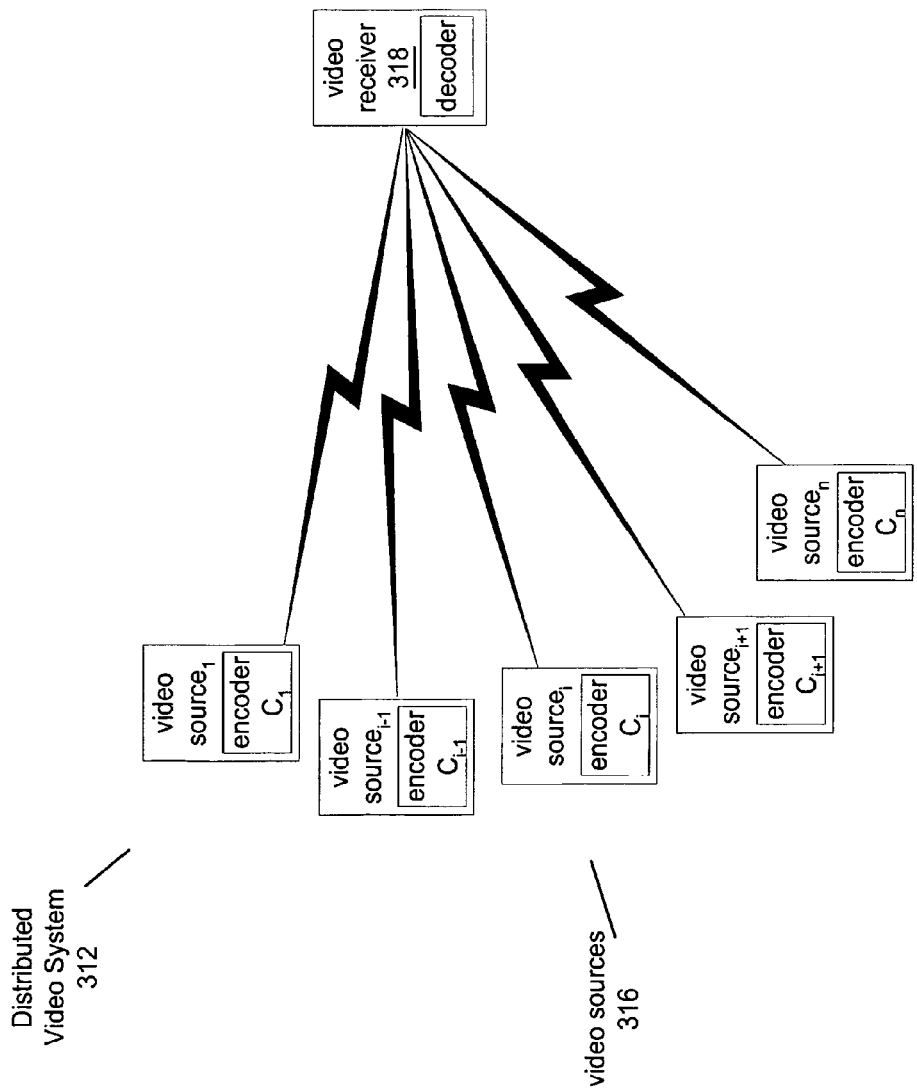

FIGS. 3A and 3B—Exemplary Systems

Various embodiments of the present invention may be directed to distributed sensor systems, wireless or wired distributed video systems, or any other type of information processing or distribution systems utilizing information coding, e.g., Slepian-Wolf coding.

For example, FIG. 3A illustrates one embodiment of a distributed sensor system. As FIG. 3A shows, a receiver 308 may be operable to receive signals, e.g., correlated signals, from a plurality of sources, specifically from a plurality of sensors 306.

However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as network control, network monitoring, financial applications, entertainment, games, etc.

Figure 4:
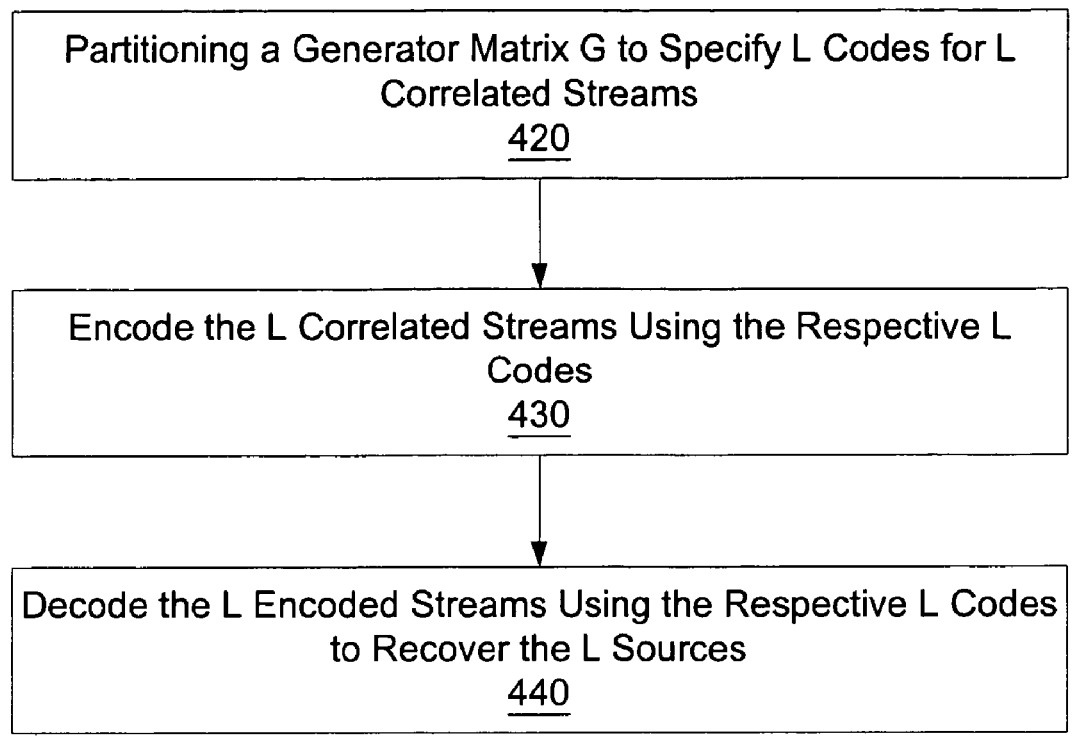
FIG. 4 is a flowchart diagram illustrating one embodiment of a method for Slepian-Wolf coding.

FIG. 4—Method for Slepian-Wolf Coding for Multiple Data Sources

FIG. 4 illustrates a method for realizing a system of L encoders and a joint decoder for L correlated sources, where L is an integer greater than or equal to two, according to one set of embodiments. In various embodiments, some of the method elements shown may be performed concurrently, in a different order than shown, or may be omitted. Additional method elements may also be performed as desired. As shown, this method may operate as follows.

In 420, L codes (including L encoders and L corresponding decoders) are specified given a generator matrix G. Embodiments of a method for specifying the L codes, given the generator matrix G, are described more fully below.

In 430, data from the L correlated sources are encoded using the L encoders, respectively. Embodiments of a method for performing the encoding are described more fully below.

In 440, the L encoded streams are decoded to recover information generated by the L sources. Embodiments of a method for performing the decoding are described more fully below.

Figure 5A:
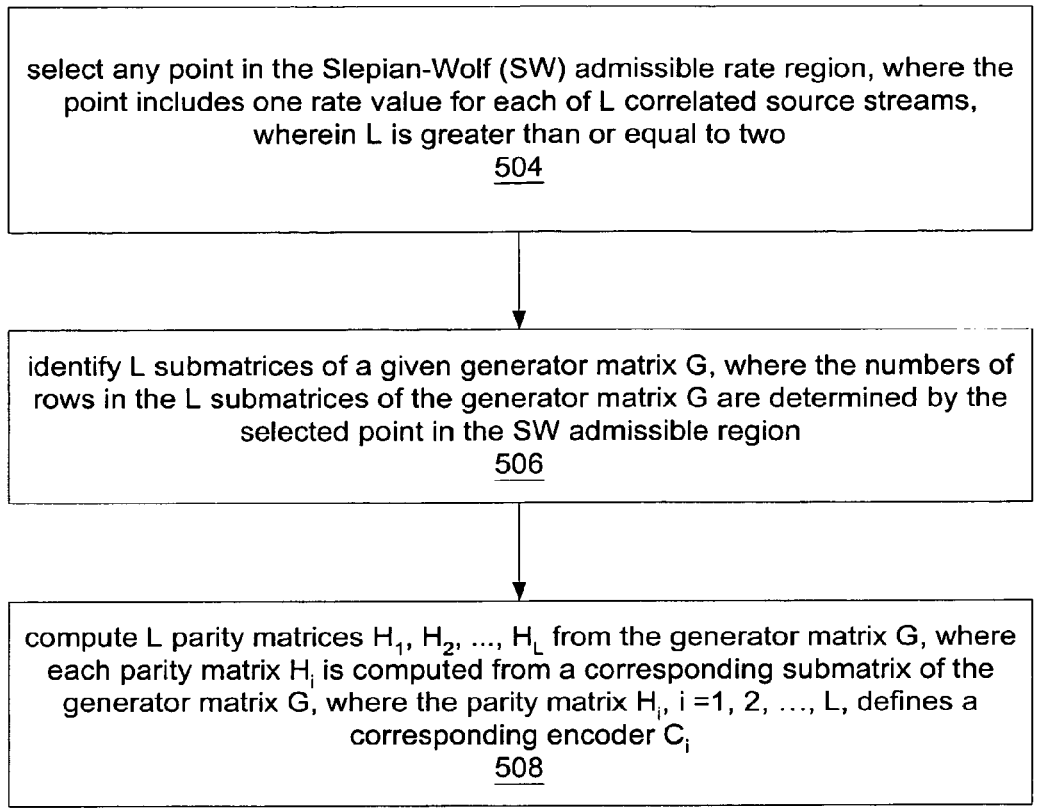
FIGS. 5A-5D flowchart more detailed embodiments of the method of FIG. 4.

FIG. 5A—Method for Specifying Slepian-Wolf Codes for Multiple Data Sources

FIG. 5A illustrates one embodiment of a method for specifying L codes for L correlated source streams. In 504, any point in the Slepian-Wolf (SW) admissible rate region may be selected. The point includes one rate value for each of the L sources streams. L is an integer greater than or equal to one (further, any point in the Slepian-Wolf (SW) admissible rate region may be selected, where the point includes one rate value for each of L correlated source streams, wherein L is greater than or equal to two). For example, a point arbitrary close to the SW sum rate limit may be selected. In various embodiments, some of the method elements shown may be performed concurrently, in a different order than shown, or may be omitted. Additional method elements may also be performed as desired. As shown, this method may operate as follows.

In 506, L submatrices of a given generator matrix G may be identified. The L submatrices may be disjoint submatrices each having the same number of columns as the matrix G. The numbers of rows in the L submatrices of the generator matrix G are determined by the selected point in the SW admissible rate region. This process of identifying L submatrices of the generator matrix G is also referred to as partitioning the generator matrix G. See below for further description of how these submatrices are identified.

In 508, L parity matrices $H_1, H_2, \ldots, H_L$ may be computed from the generator matrix G. Each parity matrix $H_i$ is computed from a corresponding submatrix of the generator matrix G. The parity matrix $H_i$, i=1, 2, ..., L, defines a corresponding encoder $C_i$ according to the relation: $(s_i)^T = H_i (x_i)^T$, wherein $x_i$ represents a block of samples from the corresponding source stream, wherein $s_i$ represents a result of the encoder $C_i$.

Figure 5B:
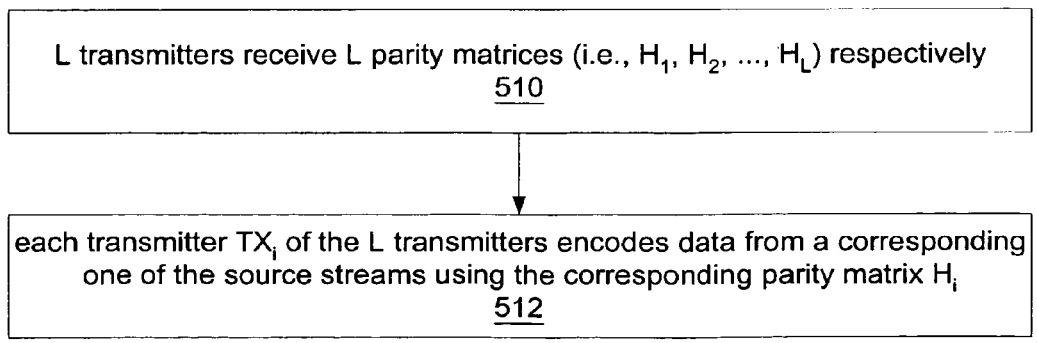

FIG. 5B—Method for Slepian-Wolf Encoding of Multiple Data Sources

FIG. 5B illustrates one embodiment of a method for operating L transmitters in order to encode L respective source streams, where L is an integer greater than or equal to two. In various embodiments, some of the method elements shown may be performed concurrently, in a different order than shown, or may be omitted. Additional method elements may also be performed as desired. As shown, this method may operate as follows.

In 510, each of the transmitters $TX_i$, i=1, 2, ..., L, receives a corresponding parity matrix $H_i$ (computed as described above). See description below for more definition of the parity matrices.

In 512, each transmitter of the L transmitters encodes data from a corresponding one of the source streams using the corresponding parity matrix $H_i$. For example, each transmitter may encode data of a corresponding source stream according to the relation: $(s_i)^T = H_i (x_i)^T$, wherein $x_i$ represents a block of samples from the corresponding source stream, wherein $s_i$ represents a result of the encoding.

Figure 5C:
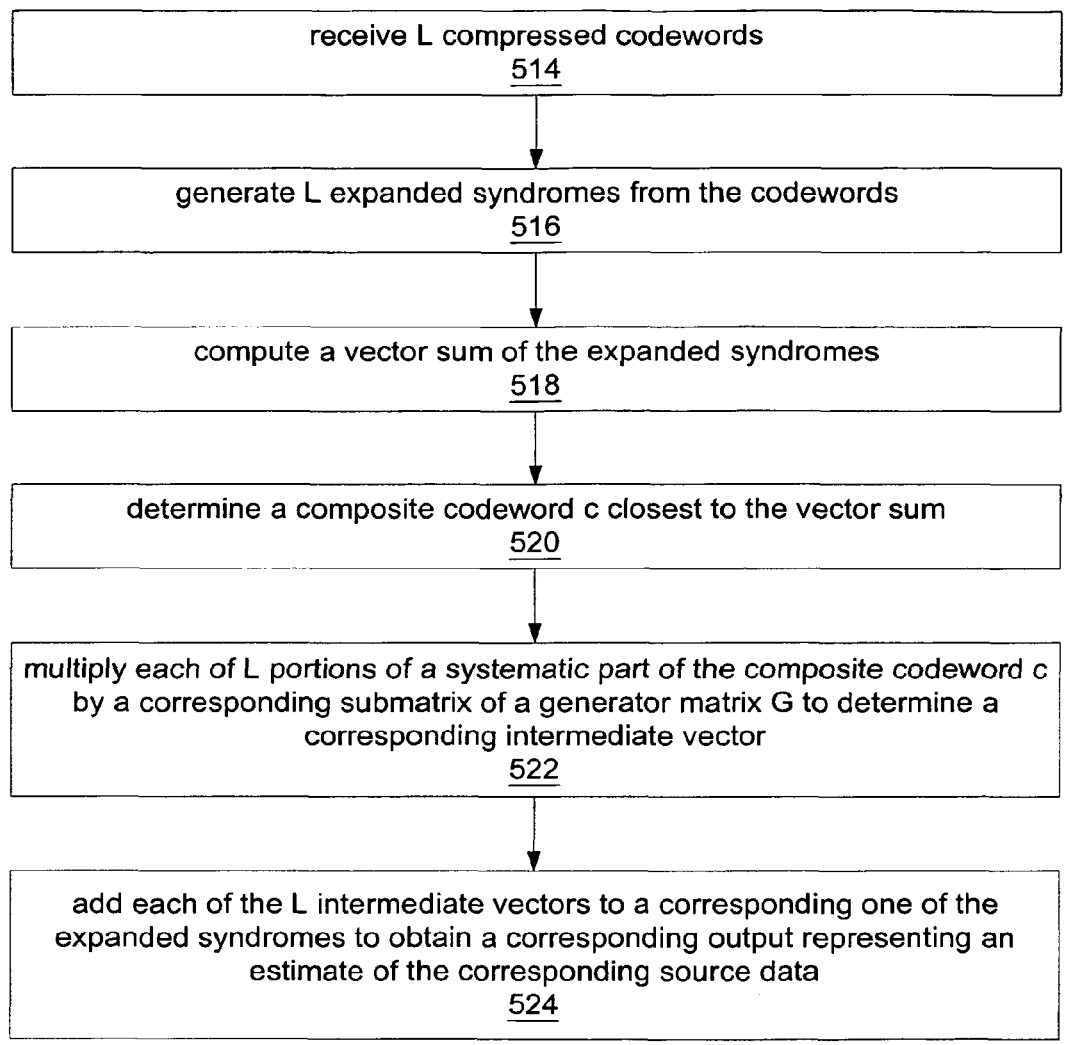
Figure 5D:
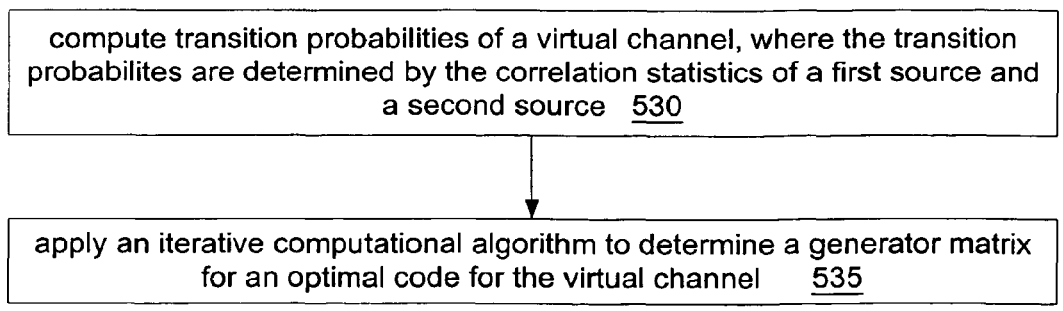

FIG. 5C—Method for Decoding Slepian-Wolf Encoded Data from Multiple Data Sources FIG. 5C illustrates one embodiment of a method for decoding L compressed streams of information, where L is greater than or equal to two. In various embodiments, some of the method elements shown may be performed concurrently, in a different order than shown, or may be omitted. Additional method elements may also be performed as desired. As shown, this method may operate as follows.

In 514, a receiver may receive L codewords $s_1, s_2, \ldots, s_L$ (e.g., from L respective transmitters). The L codewords represent data from L information sources respectively.

In 516, the receiver generates L expanded syndromes (also referred to herein as $t_1, t_2, \ldots, t_L$) from the codewords $s_1, s_2, \ldots, s_L$ by inserting zero or more zero values at appropriate locations (see discussion below) into each codeword, so that each of the expanded syndromes have the same length.

In 518, the receiver computes a vector sum of the expanded syndromes.

In 520, the receiver determines a composite codeword c closest to the vector sum (e.g., in the sense of Hamming distance).

In 522, the receiver multiplies each of L portions of a systematic part of the composite codeword c by a corresponding submatrix of a generator matrix G to obtain a corresponding intermediate vector; thus, L intermediate vectors are obtained altogether.

In 524, the receiver adds each of the L intermediate vectors to a corresponding one of the expanded syndromes to obtain a corresponding output representing an estimate of the corresponding source data.

Slepian-Wolf Coding

Various embodiments of the present invention provide a clear and detailed solution to the problem of practical implementation of Slepian-Wolf codes. More specifically, the approach is based on systematic codes so that advanced channel codes can be employed to yield Slepian-Wolf (SW) codes that can approach any point on the theoretical bound. Additionally, practical low-complexity code designs based on powerful systematic channel codes are described. In A. Liveris, Z. Xiong, and C. Georghiades, "Compression of binary sources with side information at the decoder using LDPC codes," IEEE Communications Letters, vol. 6, pp. 440-442, October 2002, it was shown that with low-density parity-check (LDPC) codes it is possible to approach the theoretical limits in the SW asymmetric scenario. Irregular repeat-accumulate (IRA) codes (see H. Jin, A. Khandekar, and R McEliece, "Irregular repeat-accumulate codes," *Proc. of 2nd International Symposium on Turbo codes and related topics*, pp. 1-8, September 2000, incorporated by reference above.) are a special form of LDPC codes which suffer very small performance loss, but can easily be coded in systematic form and have low encoding complexity which make them suitable for multiterminal coding (see T. Berger, "Multiterminal source coding", *The Information Theory Approach to Communications*, G. Longo, Ed., New York: Springer-Verlag, 1977, incorporated by reference above.). Accordingly, IRA codes have been used in experiments described herein.

Additionally, to illustrate an exemplary implementation of the present scheme with convolutional codes, powerful turbo codes (see C. Berrou, A. Glavieux, and P. Thitimajshima, "Near Shannon limit error-correcting coding and decoding: Turbo codes," *Proc. ICC '93, IEEE Int. Conf. on Comm.*, pp. 1064-1070, Geneva, 1993, incorporated by reference above.) are also treated. Turbo codes have already been successfully applied to asymmetric SW and Wyner-Ziv (see A. D. Wyner and J. Ziv, "The rate-distortion function for source coding with side information at the decoder", *IEEE Trans. on Information Theory*, vol. IT-22, pp. 1-10, January 1976, incorporated by reference above.) coding of two sources. Good results are obtained with both conventional (see, e.g., A. Liveris, Z. Xiong, and C. Georghiades, "Distributed compression of binary sources using convolutional parallel and serial concatenated convolutional codes," *Proc. DCC-2003, Data Compression Conference*, pp. 193-202, Snowbird, Utah, March 2003; and J. Chou, S. S. Pradhan and K. Ramchandran, "Turbo and trellis-based constructions for source coding with side information," Proc. DCC-2003, *Data Compression Conference*, pp. 33-42, Snowbird, Utah, March 2003, both of which were incorporated by reference above.) and nonconventional turbo schemes (see, e.g., A. Aaron and B. Girod, "Compression of side information using turbo codes," *Proc. DCC-2002, Data Compression Conference*, pp. 252-261, Snowbird, Utah, April 2002; J. Garcia-Frias and Y. Zhao, "Compression of correlated binary sources using turbo codes," *IEEE Communications Letters*, vol. 5, pp. 417-419, October 2001; and J. Bajcy and P. Mitran, "Coding for the Slepian-Wolf problem with turbo codes," *Proc. IEEE Globecom-2001*, vol. 2 pp. 1400-1404, San Antonio, Tex. November 2001, each of which were incorporated by reference above.). Various embodiments of the present invention implement symmetric SW coding using conventional punctured turbo codes.

Also presented herein is an extension of the method (see S. S. Pradhan and K. Ramchandran, "Generalized coset codes for symmetric distributed source coding," included herewith as Appendix G; and B. Rimoldi and R. Urbanke, "Asynchronous Slepian-Wolf coding via source-splitting", *Proc. ISIT-1997 IEEE Int. Symp. Information Theory*, pp. 271, Ulm, Germany, June, 1997, incorporated by reference above.) to SW coding of multiple sources (see, e.g., T. Cover, "A proof of the data compression theorem of Slepian and Wolf for ergodic sources", *IEEE Trans. on Information Theory*, vol. IT-21, pp. 226-228, March 1975, incorporated by reference above.), which is of special importance in sensor networks (and wireless video distribution, among other application domains). For example, after quantization of an observed corrupted version of the source, each distinct sensor may encode its observation by exploiting the correlation between the observations and the source (see Y. Oohama, "The Rate-Distortion Function for the Quadratic Gaussian CEO Problem," *IEEE Trans. on Information Theory*, vol. 44, pp. 1057-1070, May 1998, incorporated by reference above.).

Thus, to reach the theoretical limits (see, Y. Oohama, cited above), a code for lossless compression capable of trading-off transmission rates among sensors is needed. It is shown herein that as long as the correlation among the sources is such that their sum is a Bernoulli-p process, a single channel code can be used to approach the joint entropy limit. In addition, the complexity of encoding/decoding does not exceed that of the asymmetric codes. Furthermore, in contrast to the asymmetric codes, the obtained code has additional error detection capability.

Below, a method for designing a single code for SW coding of multiple sources is first described, then how this theoretical approach can be applied to practical code constructions using systematic IRA and turbo codes. Finally, experimental results for two sources and conclusions are provided.

Multiple Source Slepian-Wolf Coding

Consider an SW coding system which consists of L encoders and a joint decoder. Let $X_1, \ldots X_L$ be discrete, memoryless, uniformly distributed correlated random sources and let $x_i, \ldots, x_L$ denote their realizations. The i-th encoder compresses $X_i$ at rate $R_i$ independently from the information available at other encoders. The decoder receives the bitstreams from all the encoders and jointly decodes them. It should reconstruct all received source messages with arbitrarily small probability of error. The achievable rate region is then (see T. Cover, "A proof of the data compression theorem of Slepian and Wolf for ergodic sources", IEEE Trans. on Information Theory, vol. IT-21, pp. 226-228, March 1975.):

$$R_{i_1} + \ldots + R_{i_k} \geq H(X_{i_1} \ldots X_{i_k} | X_{j_1} \ldots X_{j_{L-k}}),$$

where for $k \leq L$, $\{i_1, \ldots, i_k\} \subseteq \{1, \ldots, L\}$, and $\{j_1, \ldots, j_{L-k}\} = \{1, \ldots, L\} \setminus \{i_1, \ldots, i_k\}$.

A practical code may be constructed that can potentially approach the above bound for any achievable rate allocation among the encoders. The binary case is treated, where it is assumed that all $X_i$'s are of length n bits.

Definition 1 A general SW code is a pair (C, M), where C is an (n, k) linear binary channel code given by generator matrix $G_{k \times n}$, and M is an ordered set of integers $\{m_1, \ldots, m_L\}$ such that $\Sigma_{j=1}^L m_j = k$.

For each $i=1, \ldots L$, code $C_i$ may be formed as a subcode of C with generator matrix $G_{i_{m_i \times n}}$ which consists of $m_i$ rows of G starting from row $m_1 + \ldots + m_{i-1} + 1$. Without loss of generality suppose that the code C is systematic. Let $m_{i-} = m_1 + \ldots + m_{i-1}$ and $m_{i+} = m_{i+1} + \ldots + m_L$. $I_k$ denotes the k×k identity matrix, and $O_{k1 \times k2}$ is the $k_1 \times k_2$ all-zero matrix. Then, for $G = [I_k \; P_{k \times (n-k)}]$, the generator matrix of subcode $C_i$ is $$G_i = [O_{mi \times mi-} I_{mi} O_{mi \times mi+} P_{imi \times (n-k)}], \quad (1)$$

where $P^T = [P_1^T \ldots P_L^T]$

One choice for the $(n-m_i) \times n$ parity matrix $H_i$ of $C_i$ is $$H_i = \begin{bmatrix} I_{m_{i-}} & O_{m_{i-} \times m_i} & O_{m_{i-} \times m_{i+}} & O_{m_{i-} \times (n-k)} \\ O_{m_{i+} \times m_{i-}} & O_{m_{i+} \times m_i} & I_{m_{i+}} & O_{m_{i+} \times (n-k)} \\ O_{(n-k) \times m_{i-}} & P_i^T & O_{(n-k) \times m_{i+}} & I_{n-k} \end{bmatrix}. \quad (2)$$

Encoding may be performed by multiplication of the incoming n-length vector $x_i = [u_i \; a_i \; v_i \; q_i]$ (vectors $u_i$, $a_i$, $v_i$, and $q_i$ are of length $m_{i-}$, $m_i$, $m_{i+}$, and n−k, respectively) with the parity matrix $H_i$. In this way the syndrome vector $s_i^T = H_i x_i^T$ of length $n-m_i$ may be formed as:

$$s_i^T = \begin{bmatrix} u_i^T \\ v_i^T \\ q_i^T \oplus P_i^T a_i^T \end{bmatrix}, \quad (3)$$

where ⊕ denotes addition in GF(2).

Let a length n row-vector $t_i$ be defined as $$t_i^T = \begin{bmatrix} u_i^T \\ O_{m_i \times 1} \\ v_i^T \\ q_i^T \oplus P_i^T a_i^T \end{bmatrix}. \quad (4)$$

Then, $x_i \oplus t_i = a_i G_i$ is a valid codeword of $C_i$, and thus also of C. The decoder collects all syndromes $s_1, \ldots, s_L$ and forms the sum $t_1 \oplus \ldots \oplus t_L$. From linearity, it follows that $x_1 \oplus t_1 \oplus \ldots \oplus x_L \oplus t_L$ is a valid codeword of C. The task of the decoder is then to find a codeword c that is closest (in Hamming distance) to the vector $t_1 \oplus \ldots \oplus t_L$. Let the vector $[\hat{a}_1 \ldots \hat{a}_L]$ be the systematic part of the codeword c. The sources may be recovered as: $\hat{x}_i = \hat{a}_i G_i \oplus t_i$.

Given the length of the messages n, the number of encoders L, and the set of desirable transmission rates $R_1, \ldots, R_L$ (that are achievable; see T. Cover, "A proof of the data compression theorem of Slepian and Wolf for ergodic sources", *IEEE Trans. on Information Theory*, vol. IT-21, pp. 226-228, March 1975.), parameters of the SW code may be selected in the following way:

For $i=1, \ldots, L$, $m_i = n - R_i$, $k = \Sigma_{j=1}^L m_j$. If the joint distribution of random variables $X_1, \ldots, X_L$ is such that $w(x_1 \oplus \ldots \oplus x_L) \leq t$, where $w(\cdot)$ denotes the Hamming weight, then the code C should be an $(n, k, d_H)$ code that can correct at least t errors; thus, the Hamming distance of the code is $d_H \geq 2t+1$, and from the sphere packing bound $n - k \geq \log \Sigma_{j=0}^t \binom{n}{j}$ must hold.

Proposition 1 If the parameters of a general SW code (C,M) are selected as above and the correlation of the sources is such that $w(x_1 \oplus \ldots \oplus x_L) \leq t$, then the decoding error equals zero. Proof: The proof follows directly from S. S. Pradhan and K. Ramchandran, "Distributed source coding: symmetric rates and applications to sensor networks," *Proc. DCC*-2000, *Data Compression Conference*, pp. 363-372, Snowbird, Utah, March 2000, incorporated by reference above, and the discussion above.

An advantage of this technique is that only one good channel code is needed. Indeed, for L=2, if the binary code C is approaching the capacity of a binary symmetric channel (BSC), then the general SW code (C,M) will approach the SW limit as long as the joint correlation between $X_1$ and $X_2$ can be modeled with the same BSC. However, in the case L>2, finding a channel that models the correlation among sources is more involved. As long as this correlation is such that $X_1 \oplus \ldots \oplus X_L$ is a Bernoulli-p process, a single channel code C can be efficiently designed. This can be the case in the remote multiterminal setting (T. Berger, "Multiterminal source coding", *The Information Theory Approach to Communications*, G. Longo, Ed., New York: Springer-Verlag, 1977, incorporated by reference above.) where an encoder observes only a noisy version of the source. Indeed, for the source S, an observation can be often modeled as $X_i = S + N_i$, $(i=1, \ldots, L)$, where $N_i$ is an independent and identically distributed (i.i.d.) discrete random variable independent of S.

The method may also apply to the case when C is a convolutional code, as will be shown below in an example using punctured turbo codes. For clarity, an example of the code construction for the case L=2 using a systematic channel code (a similar example but with a non-systematic code is hinted in S. S. Pradhan and K. Ramchandran, "Generalized coset codes for symmetric distributed source coding," included herewith as Appendix G; and S. S. Pradhan and K. Ramchandran, "Distributed source coding: symmetric rates and applications to sensor networks," *Proc. DCC*-2000, *Data Compression Conference*, pp. 363-372, Snowbird, Utah, March 2000, incorporated by reference above) is presented. Let X and Y be two discrete memoryless uniformly distributed variables of length seven bits such that the Hamming distance between them is at most one. The source messages are separately encoded and sent to a joint decoder. The decoder then attempts to losslessly reconstruct both sources.

The SW bound for this case is 10 bits (see D. Slepian and J. K. Wolf, "Noiseless coding of correlated information sources," *IEEE Trans. On Information Theory*, vol. IT-19, pp. 471-480, July 1973, incorporated by reference above). This bound can be achieved in the asymmetric scenario by transmitting one source, e.g., X, at rate $R_1 = H(X) = 7$ bits and by coding the second source, Y, at $R_2 = H(Y|X) = 3$ bits. It is shown how the same total rate can be achieved with the symmetric approach by using $R_1 = R_2 = 5$ bits. Since n=7 bits, and a code is desired that can correct at least one bit error, for an SW code C the systematic (7,4) Hamming code is selected, defined by the generator matrix:

$$G_{k \times n} = [I_4 P] = \begin{bmatrix} 1 & 0 & 0 & 0 & 1 & 0 & 1 \\ 0 & 1 & 0 & 0 & 1 & 1 & 0 \\ 0 & 0 & 1 & 0 & 1 & 1 & 1 \\ 0 & 0 & 0 & 1 & 0 & 1 & 1 \end{bmatrix}.$$

Its parity matrix is:

$$H = \begin{bmatrix} 1 & 1 & 1 & 0 & 1 & 0 & 0 \\ 0 & 1 & 1 & 1 & 0 & 1 & 0 \\ 1 & 0 & 1 & 1 & 0 & 0 & 1 \end{bmatrix}.$$

Further two subcodes of C, $C_1$ and $C_2$, may be constructed by splitting G into two generator matrices, $G_1$ that contains the first m=2 rows of G, and $G_2$ that contains the last two rows. X may be coded using $C_1$ and Y using $C_2$. Let $P^T = [P_1^T \; P_2^T]$. Then for the $(n-m) \times n$ parity-check matrices $H_1$ and $H_2$ of $C_1$ and $C_2$, respectively, the following may be obtained from (2):

$$H_1 = \begin{bmatrix} O_{m \times m} & I_m & O_{m \times (n-k)} \\ P_1^T & O_{(n-k) \times m} & I_{n-k} \end{bmatrix}$$

$$= \begin{bmatrix} O_{m \times m} & I_{n-m} \\ P_1^T & \end{bmatrix}$$

$$= \begin{bmatrix} 0 & 0 & 1 & 0 & 0 & 0 & 0 \\ 0 & 0 & 0 & 1 & 0 & 0 & 0 \\ 1 & 1 & 0 & 0 & 1 & 0 & 0 \\ 0 & 1 & 0 & 0 & 0 & 1 & 0 \\ 1 & 0 & 0 & 0 & 0 & 0 & 1 \end{bmatrix},$$

$$H_2 = \begin{bmatrix} I_m & O_{m \times m} & O_{m \times (n-k)} \\ O_{(n-k) \times m} & P_2^T & I_{n-k} \end{bmatrix} = \begin{bmatrix} 1 & 0 & 0 & 0 & 0 & 0 & 0 \\ 0 & 1 & 0 & 0 & 0 & 0 & 0 \\ 0 & 0 & 1 & 0 & 0 & 0 & 0 \\ 0 & 0 & 1 & 1 & 0 & 1 & 0 \\ 0 & 0 & 1 & 1 & 0 & 0 & 1 \end{bmatrix}$$

since both $H_1$ and $H_2$ have rank n−m and $H_1 G_1^T = H_2 G_2^T = O_{(n-m) \times m}$.

Let realizations of the sources be x=[0 0 1 0 1 1 0] and y=[0 1 1 0 1 1 0]. Since the Hamming distance between x and y is one, it should be possible to decode the messages correctly.

Syndromes for both x and y may be formed. To do so, x and y may be written in the form $x=[a_1 v_1 q_1]=[00\ 10\ 110]$, $y=[u_2 a_2 q_2]=[01\ 10\ 110]$.

The length n−m syndromes, $s_1$ and $s_2$, formed by the two subcodes are $$s_1^T = H_1 x^T = \begin{bmatrix} v_1^T \\ P_1^T a_1^T \oplus q_1^T \end{bmatrix} = [10110]^T$$

$$s_2^T = H_2 y^T = \begin{bmatrix} u_2^T \\ P_2^T a_2^T \oplus q_2^T \end{bmatrix} = [01001]^T.$$

The length n row-vectors $t_1$ and $t_2$ may then be given by $$t_1^T = \begin{bmatrix} O_{m\times 1} \\ v_1^T \\ P_1^T a_1^T \oplus q_1^T \end{bmatrix} = [0010110]^T$$

$$t_2^T = \begin{bmatrix} u_2^T \\ O_{m\times 1} \\ P_2^T a_2^T \oplus q_2^T \end{bmatrix} = [0100001]^T.$$

Then the row-vectors $x \oplus t_1$ and $y \oplus t_2$ are codewords of the codes $C_1$ and $C_2$, respectively.

Thus, by sending $s_1$ and $s_2$ from the two encoders to the joint decoder, the decoder may find the codeword in C that is closest to $t_1 \oplus t_2=[0110111]$. Since there is no error in decoding, this codeword may be $x \oplus t_1 \oplus y \oplus t_2 = [0010111]$ because the Hamming distance between x and y is one and the minimal Hamming distance of the code C is three. The corresponding reconstructions $\hat{a}_1 = a_1$ and $\hat{a}_2 = a_2$ may then be obtained as the systematic part of the codeword. Since $a_1 G_1 = x \oplus t_1$ and $a_2 G_2 = y \oplus t_2$, the sources may be reconstructed as $\hat{x} = \hat{a}_1 G_1 \oplus t_1 = [0010110] = a_1 G_1 \oplus t_1$, $\hat{y} = \hat{a}_2 G_2 \oplus t_2 = [0110110] = a_2 G_2 \oplus t_2$. It may thus be seen that x and y are indeed recovered error-free.

Practical Code Design

Practical SW codes using systematic IRA and turbo codes may be designed as described below using the notation established above.

Systematic IRA Codes

The present methods may be applied to systematic IRA codes (see H. Jin, A. Khandekar, and R McEliece, "Irregular repeat-accumulate codes," *Proc. of 2nd International Symposium on Turbo codes and related topics*, pp. 1-8, September 2000, incorporated by reference above.). Systematic IRA codes are powerful channel codes that combine the advantages of LDPC codes (message passing iterative decoding, simple analysis and code design) and turbo codes (linear time encoding). Their performance is comparable to that of irregular LDPC codes of the same codeword length. For simplicity, symmetric SW coding of two binary sources X and Y are considered. Code construction for the general case is essentially the same.

Figure 6:
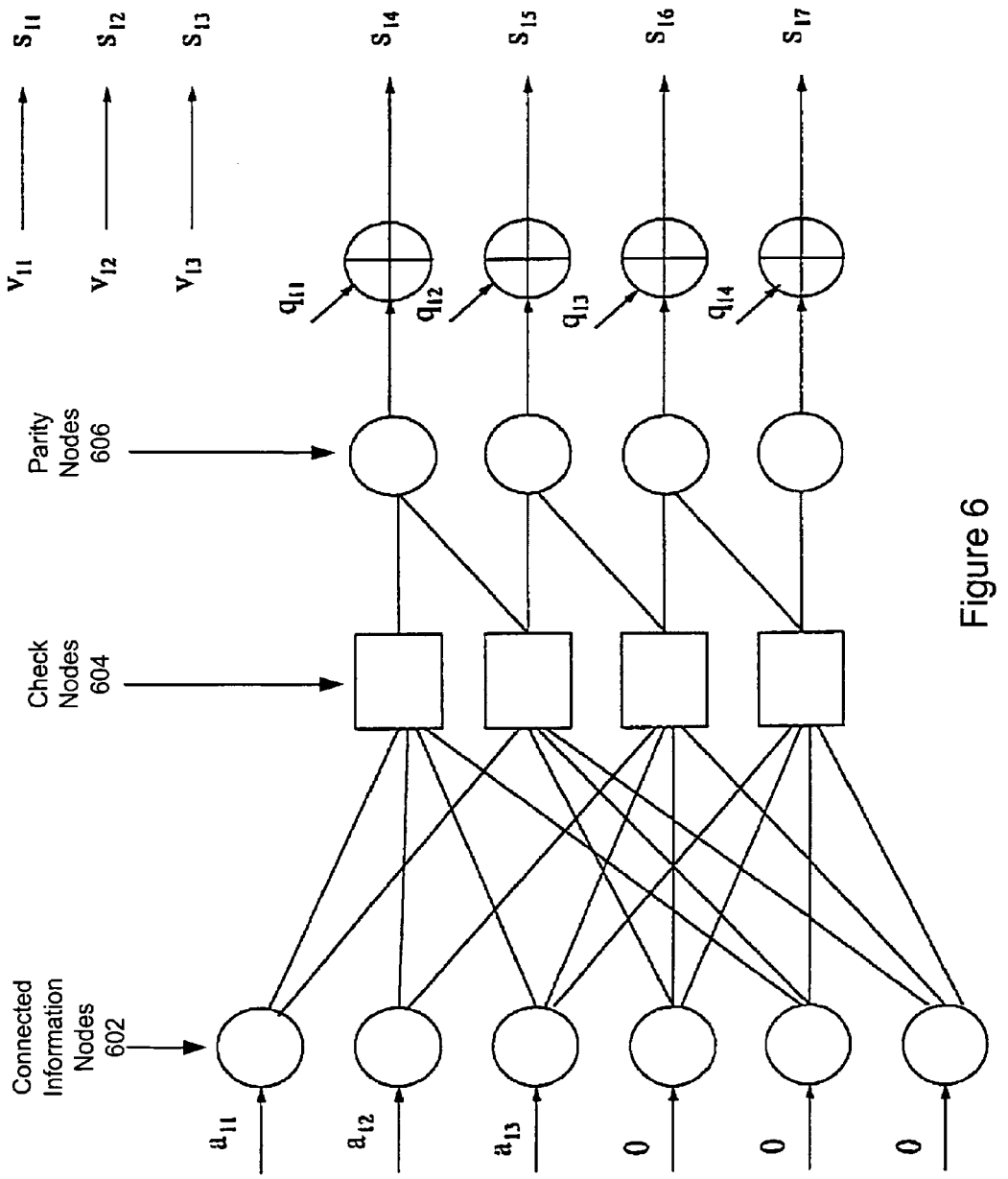
FIG. 6 illustrates Slepian-Wolf encoding, according to one embodiment.

FIG. 6—Encoding Multiple Data Sources

FIG. 6 illustrates one embodiment of encoding of a source x. As FIG. 6 shows, in this example, at each check (square) node 604 all the connected information nodes 602 (cycles on the left) are modulo-2 added and corresponding values of the parity nodes 606 (cycles on the right) are determined. Then, $q_1$ is modulo-2 added. Here n=10, k=6, m=3, $\lambda(x)=0.25x+0.75x^2$, and $\rho(x)=x^3$.

At the first encoder, the length n source output x is split into three parts in the form $x=[a_1 v_1 q_1]$ (5)

where $a_1$, $v_1$ are row-vectors of length m=k/2 and $q_1$ is a row-vector of length n−k=n−2m.

First, $a_1 P_1$ may be determined by setting the values of the systematic IRA variable nodes to $[a_1\ O_{1\times m}]$, that is, half of the systematic part may be set to zero.

Next, the length n−m syndrome $s_1$ that is formed by the first encoder may be obtained by appending $v_1$ to $u_1 P_1 \oplus q_1$. The encoding procedure is represented in FIG. 6.

In a similar way, $s_2$ may be formed at the second encoder from $y=[u_2\ a_2\ q_2]$. At the joint decoder, first, vectors $t_1$ and $t_2$ may be formed as explained above; then, a common IRA decoding of $t_1 \oplus t_2$ may be performed, and $\hat{a}_1$ and $\hat{a}_2$ obtained as the systematic part of the recovered codeword; finally, $\hat{x}$ and $\hat{y}$ may be reconstructed as:

$\hat{x}=[\hat{a}_1 O_{1\times n}]G \oplus t_1$, (6)

$\hat{y}=[O_{1\times m} \hat{a}_2]G \oplus t_2$. (7)

As a result, if the used systematic IRA code can approach the capacity of a channel, then if the same channel models the statistics of $x \oplus y$, the resulting IRA coding scheme based on the above setup will also approach the SW limit for any rate allocation between the encoders. The procedure can be generalized to any asymmetric scenario with any number of sources. However, when more than two sources are used, modeling the exact correlation with a channel is more involved and hence more challenging.

Turbo Codes

The SW code construction with systematic turbo codes (see C. Berrou, A. Glavieux, and P. Thitimajshima, "Near Shannon limit error-correcting coding and decoding: Turbo codes," *Proc. ICC '93, IEEE Int. Conf. on Comm.*, pp. 1064-1070, Geneva, 1993, incorporated by reference above.) is now briefly explained. Although turbo codes consist of two convolutional coders, they can be treated as linear block codes. Thus, the technique described above may be applied without modification. Indeed, assuming again the symmetric scenario, for the source realization x given by (5), $a_1 P_1$ may be determined by coding the k-length vector $[a_1\ O_{1\times m}]$ with the first convolutional encoder. The vector $[a_1\ O_{1\times m}]$ may also be interleaved and fed into the second encoder. The syndrome may be formed then as:

$s_1=[v_1 a_1 P_1 \oplus q_1]^T$.

To get $\hat{a}_1$ and $\hat{a}_2$ at the decoder, iterative maximum a posteriori decoding may be applied to the vector $t_1 \oplus t_2$ from (4). Then, $\hat{x}$ and $\hat{y}$ may be obtained from (6) and (7), respectively.

Figure 7:
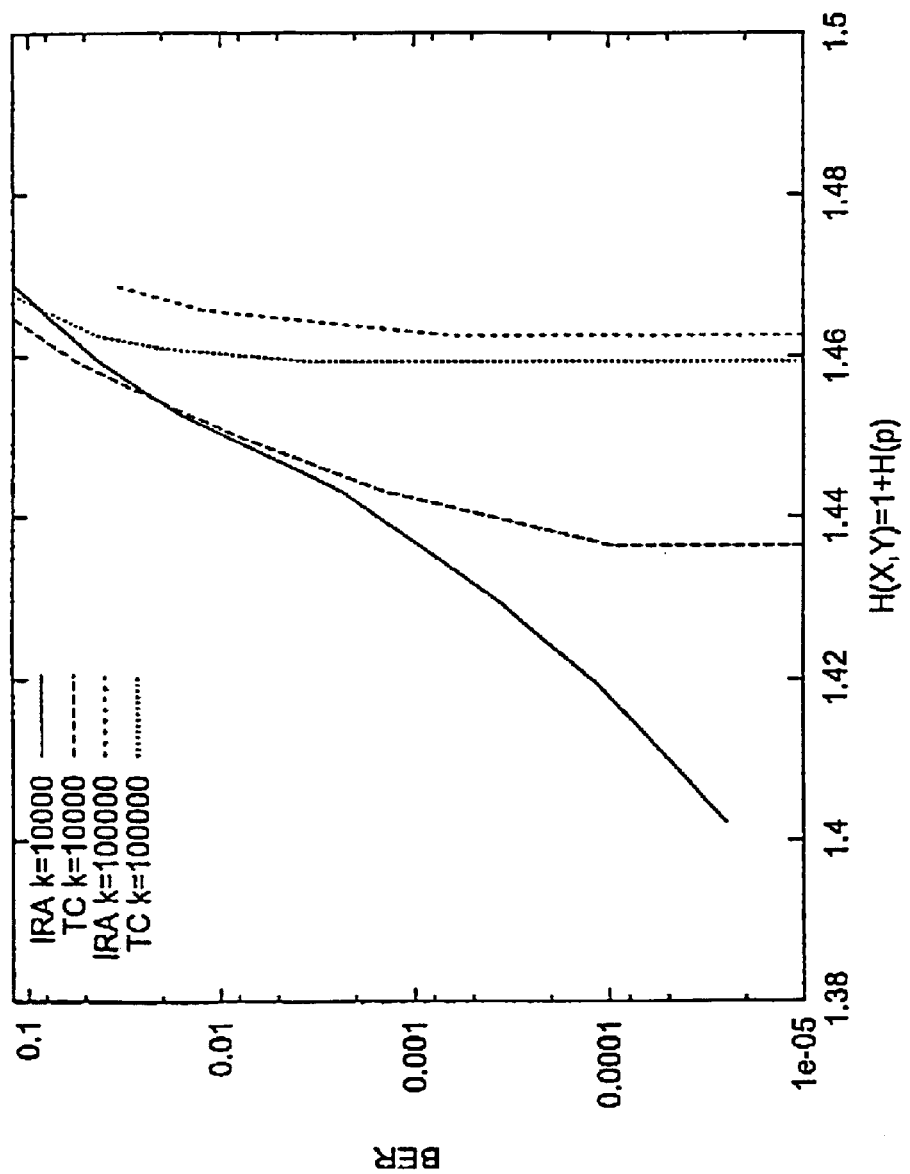
FIGS. 7 and 8 illustrate simulation results with IRA codes and turbo codes together with the SW bound, according to one embodiment.
Figure 8:
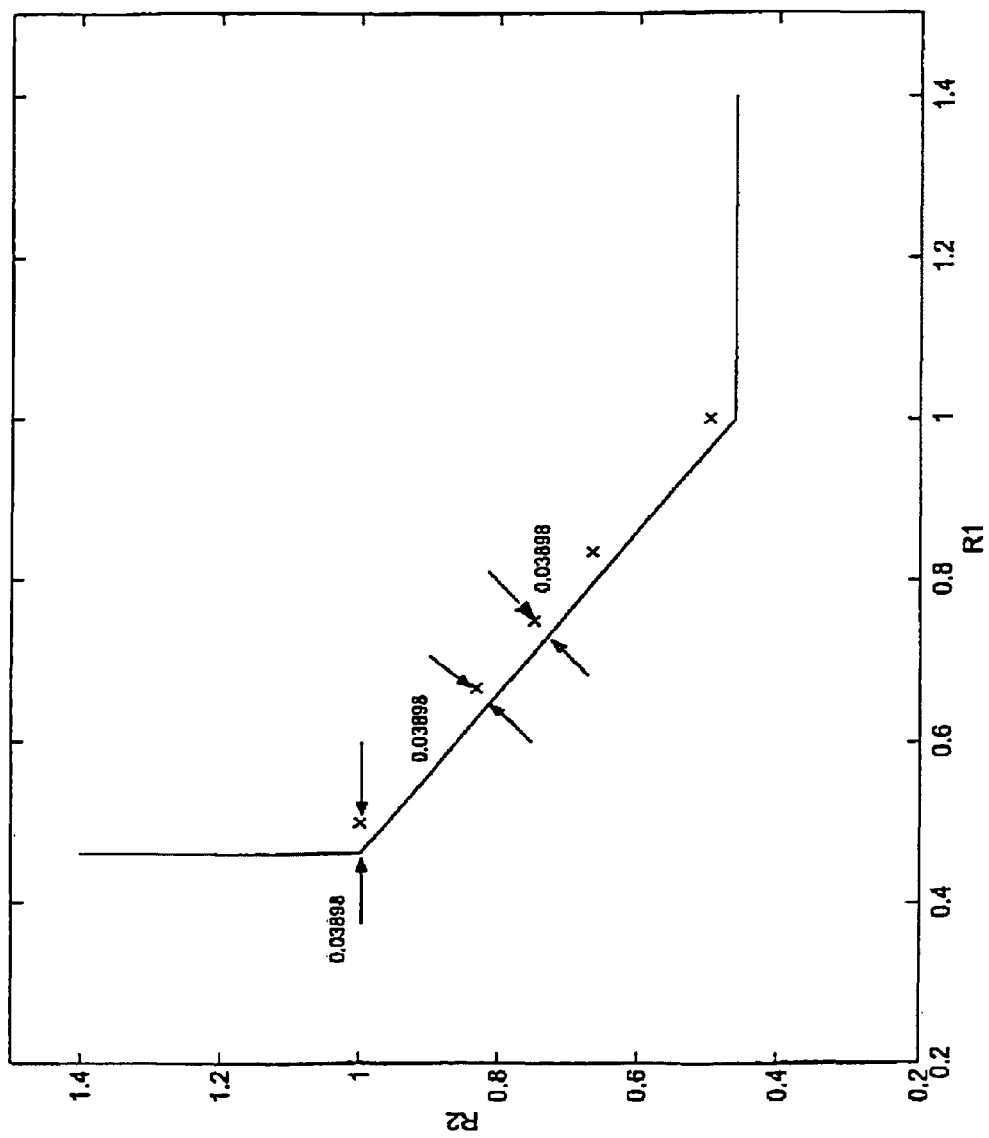

FIGS. 7 & 8—Results

A simulation of SW coding of two i.i.d. binary discrete sources X and Y whose correlation is modeled as a BSC with crossover probability p was conducted. Experimental results for IRA and turbo codes are provided below.

In these experiments, the used systematic (n, k) IRA code is with rate 0.50227 and the degree distribution polynomials are (see H. Jin, A. Khandekar, and R McEliece, "Irregular repeat-accumulate codes," *Proc. of 2nd International Symposium on Turbo codes and related topics*, pp. 1-8, September 2000, incorporated by reference above.): $\lambda(x)=0.252744x^2+$ $0.081476x^{11}+0.327162x^{12}+0.184589x^{46}+0.154029x^{48}$, $p(x)=x^8$. The number of iterations in the decoder was limited to 200.

The turbo encoder includes two identical recursive systematic convolutional encoders (from W. E. Ryan, "A Turbo Code Tutorial," included herewith as Appendix F) with memory length 4, generators (31, 27) octal, and code rate ⅓. The parity bits of both encoders were punctured to achieve the code rate of ½. A maximum a posteriori algorithm was used for decoding, with the number of iterations limited to 20.

Obtained results are shown in FIG. 7. The SW bound is 1.5 bits. The information block length was k=104 and k=105 bits. For each point at least $10^8$ codeword bits were simulated. The results are given as residual bit error rate (BER) averaged over the two sources as a function of the joint entropy $H(X,Y)=H(X)+H(X|Y)=1+H(p)$.

FIG. 7 illustrates BER averaged over the two sources as a function of the joint entropy $H(X,Y)=1+H(p)$ for two different information block lengths k and two different channel coders. It can be seen that similar performances were obtained with both coders. With the length of k=10 the gap to the SW limit was about 0.04 bits, which is comparable to the results of the asymmetric approach with LDPC reported in A. Liveris, Z. Xiong, and C. Georghiades, "Compression of binary sources with side information at the decoder using LDPC codes," IEEE Communications Letters, vol. 6, pp. 440-442, October 2002. Note that according to the present coding procedure, usually either both sources are recovered error-free or both are corrupted. Also, because of the additional encodings at the decoder side, the errors propagate. Thus, either the whole messages are perfectly reconstructed or they are heavily damaged. (This is the reason why the drop for k=10 with IRA codes was not sharp as expected.) Therefore, the decoder can detect errors with high certainty by comparing the two reconstructions.

FIG. 8 illustrates results with IRA codes and k=105 together with the SW bound. More specifically, three different rate allocations among the encoders were simulated by changing the number of rows ($m_1$ and $m_2$) in the generator matrices of subcodes assigned to two encoders. In addition to the symmetric scenario, where $m_1=m_2=k/2$, with obtained equal rates of both encoders, $R_1=R_2=(n-k/2)/n$, two asymmetric cases were also treated. In the first case, $m_1=k/3$ and $m_2=2k/3$, resulting in $R_1=(n-k/3)/n$ and $R_2=(n-2k/3)/n$. Finally, in the totally asymmetric scenario, $m_1$ was set to zero, and $m_2$ to k, which resulted in $R_1=H(X)=1$ and $R_2=H(Y|X)=(n-k)/n$. Results obtained with the IRA based scheme and k=105 together with the SW bound are shown in FIG. 8. Error-free transmission was assumed if BER was lower than $10^{-6}$. As expected, all three cases resulted in the same gap of 0.039 bits to the bound. Thus, the different rate allocations did not affect the performance. Similar results were obtained with the punctured turbo coder.

CONCLUSIONS AND BENEFITS

Thus, based on the above precise and detailed interpretation of Pradhan and Ramchandran's outlined method for constructing a single channel code that achieves arbitrary rate allocation among two encoders in the SW coding problem (see S. S. Pradhan and K. Ramchandran, "Generalized coset codes for symmetric distributed source coding," included herewith as Appendix G; and S. S. Pradhan and K. Ramchandran, "Distributed source coding: symmetric rates and applications to sensor networks," Proc. DCC-2000, Data Compression Conference, pp. 363-372, Snowbird, Utah, March 2000, incorporated by reference above.), based on the systematic setup, a low-complexity coding designs using advanced systematic IRA and turbo codes that are capable of approaching any point on the SW bound has been provided.

Additionally, these results were extended to SW coding of multiple sources (see T. Cover, "A proof of the data compression theorem of Slepian and Wolf for ergodic sources", IEEE Trans. on Information Theory, vol. IT-21, pp. 226-228, March 1975, incorporated by reference above.). It has been shown herein that for a particular correlation model among sources, a single code can be designed, which is an important advantage of the present method, as a single code can be used to approach the joint entropy limit. Note that if the designed code approaches the capacity of the channel that models correlation, then the system will approach the theoretical limit. Thus, even when the number of sources is high, since all the sources are decoded by a single code, only one (good) code is needed. In addition, low complexity and the inherent error detection capability make the present method beneficial and desirable for both direct and remote multiterminal problems (see T. Berger, "Multiterminal source coding", The Information Theory Approach to Communications, G. Longo, Ed., New York: Springer-Verlag, 1977, incorporated by reference above.).

It is noted that to approach the theoretical limits in multiterminal coding with a fidelity criterion, after quantization of the sources, lossless coding may be needed to further decrease the rate (see S. S. Pradhan and K. Ramchandran, "Distributed source coding using syndromes (DISCUS): design and construction," Proc. DCC-1999, Data Compression Conference, pp. 158-167, Snowbird, Utah, March 1999; J. Chou, S. S. Pradhan and K. Ramchandran, "Turbo and trellis-based constructions for source coding with side information," Proc. DCC-2003, Data Compression Conference, pp. 33-42, Snowbird, Utah, March 2003; and Y. Yang, S. Chen, Z. Xiong, and W. Zhao, "Wyner-Ziv coding based on TCQ and LDPC codes," Proc. of 37th Asilomar Conference on Signals, Systems, and Computers, Pacific Grove, Calif., November 2003, all of which were incorporated by reference above). Hence, in some embodiments, the method proposed herein may be applied in this second compression step. Therefore, the design of a single practical code for an entire multi-source system, e.g., a whole sensor network, that can approach or even reach the theoretical limits is feasible.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
    at a first of L encoding systems,
        encoding, using an electronic device, a first of L correlated information sources using a first of L distinct submatrices of a parity check matrix, in order to generate a first of L syndromes;
    sending the generated first syndrome to a joint decoder;
        wherein the L distinct submatrices of the parity check matrix are derived from L corresponding submatrices of a generator matrix G,
        wherein the L submatrices of the generator matrix G have ranks determined by a point selected in a Slepian-Wolf admissible rate region.

2. The method of claim 1, wherein the joint decoder is configured to:
    receive the L syndromes; and decode the L syndromes using, respectively, the L submatrices of the generator matrix G.

3. The method of claim 1, wherein the electronic device includes:
a processor configured to execute program instructions; or one or more application-specific integrated circuits (ASICs); or
a combination of the processor configured to execute program instructions and one or more ASICs.

4. The method of claim 1, wherein the L correlated information sources include sensors in a distributed sensor network.

5. The method of claim 1, wherein the L correlated information sources include at least video sources, audio sources, or both video sources and audio sources in a distributed network.

6. An apparatus comprising:
one or more processors; and
a memory storing instructions that, when executed by the one or more processors, cause the one or more processors to perform operations comprising:
encoding a first of L correlated information sources using a first of L distinct submatrices of a parity check matrix, in order to generate a first of L syndromes;
sending the first syndrome to a joint decoder;
wherein the L distinct submatrices of the parity check matrix are derived from L corresponding submatrices of a generator matrix G,
wherein the L submatrices of the generator matrix G have ranks determined by a point selected in a Slepian-Wolf admissible rate region.

7. The apparatus of claim 6, wherein the L correlated information sources include sensors in a distributed sensor network.

8. The apparatus of claim 6, wherein the L correlated information sources include at least video sources, audio sources, or both video sources and audio sources in a distributed network.

9. A tangible, non-transitory computer-readable medium having computer-executable instructions stored thereon that, if executed by a computing device, cause the computing device to perform operations comprising:
encoding a first of L correlated information sources using a first of L distinct submatrices of a parity check matrix, in order to generate a first of L syndromes;
sending the first syndrome to a joint decoder;
wherein the L distinct submatrices of the parity check matrix are derived from L corresponding submatrices of a generator matrix G,
wherein the L submatrices of the generator matrix G have ranks determined by a point selected in a Slepian-Wolf admissible rate region.

10. The tangible, non-transitory computer-readable medium of claim 9, wherein the L correlated information sources include sensors in a distributed sensor network.

11. The tangible, non-transitory computer-readable medium of claim 9, wherein the L correlated information sources include at least video sources, audio sources, or both video sources and audio sources in a distributed network.

12. A method of decoding Slepian-Wolf encoded data, the method comprising:
receiving a plurality of syndromes associated with Slepian-Wolf encoded data, the plurality of syndromes including L syndromes from L corresponding transmitters, wherein L is greater than one;
computing, using an electronic device, a codeword using the L syndromes;
multiplying, using the electronic device,
each of L portions of the codeword by a corresponding submatrix of a generator matrix G to determine a corresponding vector,
wherein the submatrices of the generator matrix G has a dimension corresponding to a point in a Slepian-Wolf admissible rate region; and
generating, using the electronic device, decoded outputs based on the vectors.

13. The method as defined in claim 12, wherein the corresponding vector is an intermediate vector.

14. The method as defined in claim 12, wherein the point in a Slepian-Wolf admissible rate region is arbitrarily close to a Slepian-Wolf sum rate limit.

15. The method as defined in claim 12, wherein the dimension is a row dimension.

16. The method as defined in claim 12, wherein the plurality of syndromes is received via L codewords from the L transmitters.

17. The method as defined in claim 12, wherein the plurality of syndromes is received via L codewords from the L transmitters, the method further comprising:
generating L expanded syndromes by inserting zero values at appropriate locations so that each of the L expanded syndromes are of the same length.

18. The method as defined in claim 12, wherein the L corresponding transmitters are associated with corresponding sensors in a distributed sensor network.

19. The method as defined in claim 12, wherein the L corresponding transmitters are associated with video sources, audio sources, or both video and audio sources in a distributed sensor network.

20. The method of claim 12, wherein the electronic device includes:
a processor configured to execute program instructions,
one or more application-specific integrated circuits (ASICs) or
a combination of the processor configured to execute program instructions and one or more ASICs.

21. An apparatus comprising:
one or more processors; and
a memory storing instructions that, when executed by the one or more processors, cause the one or more processors to perform operations comprising:
receiving a plurality of syndromes associated with Slepian-Wolf encoded data, the plurality of syndromes including
L syndromes from L corresponding transmitters, wherein L is greater than one;
computing, using an electronic device, a codeword using the L syndromes;
multiplying, using the electronic device,
each of L portions of the codeword by a corresponding submatrix of a generator matrix G to determine a corresponding vector,
wherein the submatrices of the generator matrix G has a dimension corresponding to a point in a Slepian-Wolf admissible rate region; and
generating, using the electronic device, decoded outputs based on the vectors.

22. The apparatus as defined in claim 21, wherein the corresponding vector is an intermediate vector.

23. The apparatus as defined in claim 21, wherein the dimension is a row dimension.

24. The apparatus as defined in claim 21, wherein the plurality of syndromes is received via L codewords from the L transmitters.

25. The apparatus as defined in claim 21, wherein the plurality of syndromes is received via L codewords from the L transmitters, the operations further comprising:
 generating L expanded syndromes by inserting zero values at appropriate locations so that each of the L expanded syndromes are of the same length.

26. A tangible, non-transitory computer-readable medium having computer-executable instructions stored thereon that, if executed by a computing device, cause the computing device to perform operations comprising:
 receiving a plurality of syndromes associated with Slepian-Wolf encoded data, the plurality of syndromes including L syndromes from L corresponding transmitters, wherein L is greater than one;
 computing, using an electronic device, a codeword using the L syndromes;
 multiplying, using the electronic device,
  each of L portions of the codeword by a corresponding submatrix of a generator matrix G to determine a corresponding vector,
  wherein the submatrices of the generator matrix G has a dimension corresponding to a point in a Slepian-Wolf admissible rate region; and
 generating, using the electronic device, decoded outputs based on the vectors.

27. The tangible, non-transitory computer-readable medium as defined in claim 26, wherein the corresponding vector is an intermediate vector.

28. The tangible, non-transitory computer-readable medium as defined in claim 26, wherein the dimension is a row dimension.

29. The tangible, non-transitory computer-readable medium as defined in claim 26, wherein the plurality of syndromes is received via L codewords from the L transmitters, the operations further comprising:
 generating L expanded syndromes by inserting zero values at appropriate locations so that each of the L expanded syndromes are of the same length.

\* \* \* \* \*

UNITED STATES PATENT AND TRADEMARK OFFICE
CERTIFICATE OF CORRECTION

PATENT NO. : 8,065,592 B2  
APPLICATION NO. : 12/847968  
DATED : November 22, 2011  
INVENTOR(S) : Stankovic et al.

Page 1 of 1

It is certified that error appears in the above-identified patent and that said Letters Patent is hereby corrected as shown below:

Page 3, item (56), under "Other Publications", in Column 1, line 7, delete "pp. 271-278." and insert -- pp. 271-278; Seattle, WA. --.

Column 20, line 33, in Claim 20, delete "The method of claim 12," and insert -- The method as defined in claim 12, --.

Column 20, line 37, in Claim 20, delete "(ASICs) or" and insert -- (ASICs); or --.

Signed and Sealed this  
Twenty-ninth Day of May, 2012

David J. Kappos  
*Director of the United States Patent and Trademark Office*